US011335788B2

(12) United States Patent
Ramaswamy et al.

(10) Patent No.: US 11,335,788 B2
(45) Date of Patent: May 17, 2022

(54) SEMICONDUCTOR DEVICES, TRANSISTORS, AND RELATED METHODS FOR CONTACTING METAL OXIDE SEMICONDUCTOR DEVICES

(71) Applicant: Micron Technology, Inc., Boise, ID (US)

(72) Inventors: Durai Vishak Nirmal Ramaswamy, Boise, ID (US); Ramanathan Gandhi, Boise, ID (US); Scott E. Sills, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/118,064

(22) Filed: Aug. 30, 2018

(65) Prior Publication Data

US 2019/0067437 A1    Feb. 28, 2019

Related U.S. Application Data

(60) Provisional application No. 62/552,809, filed on Aug. 31, 2017.

(51) Int. Cl.
| | |
|---|---|
| *H01L 27/108* | (2006.01) |
| *H01L 21/8254* | (2006.01) |
| *H01L 49/02* | (2006.01) |
| *H01L 29/45* | (2006.01) |
| *H01L 29/786* | (2006.01) |

(Continued)

(52) U.S. Cl.
CPC ........ *H01L 29/45* (2013.01); *H01L 29/42356* (2013.01); *H01L 29/66969* (2013.01); *H01L 29/7869* (2013.01); *H01L 29/78642* (2013.01); *H01L 29/78693* (2013.01);
(Continued)

(58) Field of Classification Search
CPC ............. H01L 27/1225; H01L 29/7869; H01L 29/045; H01L 29/66969; H01L 29/78693; H01L 29/78696
See application file for complete search history.

(56) References Cited

U.S. PATENT DOCUMENTS

| | | | |
|---|---|---|---|
| 5,739,057 A | 4/1998 | Tiwari et al. | |
| 6,261,950 B1 * | 7/2001 | Tobben | ............. H01L 21/76886 257/E21.591 |

(Continued)

FOREIGN PATENT DOCUMENTS

| | | |
|---|---|---|
| JP | 07-099286 A | 7/1987 |
| JP | 08-330593 A | 10/1994 |

(Continued)

OTHER PUBLICATIONS

International Written Opinion from International Application No. PCT/US2018/048936, dated Dec. 21, 2018, 9 pages.

(Continued)

*Primary Examiner* — Brian Turner
(74) *Attorney, Agent, or Firm* — TraskBritt

(57) ABSTRACT

A semiconductor device is disclosed. The semiconductor device includes a transistor including a source contact, a drain contact, and a channel region including an oxide semiconductor material as the channel material. At least one of the drain contact or the source contact includes a conductive material, such as ruthenium, to reduce the Schottky effects at the interface with the channel material.

20 Claims, 13 Drawing Sheets

(51) Int. Cl.
    *H01L 29/66*     (2006.01)
    *H01L 29/423*     (2006.01)
    *H01L 29/78*     (2006.01)

(52) U.S. Cl.
    CPC .. *H01L 27/10805* (2013.01); *H01L 27/10873* (2013.01); *H01L 29/7827* (2013.01)

(56) References Cited

U.S. PATENT DOCUMENTS

| | | |
|---|---|---|
| 6,420,784 B2 | 7/2002 | Hu |
| 6,888,769 B2 | 5/2005 | Kirsch |
| 7,842,558 B2 | 11/2010 | Juengling |
| 8,514,626 B2 | 8/2013 | Sandhu et al. |
| 8,530,939 B2 | 9/2013 | Sills et al. |
| 8,541,765 B2 | 9/2013 | Marsh et al. |
| 8,598,562 B2 | 12/2013 | Sills |
| 8,652,909 B2 | 2/2014 | Sills et al. |
| 8,711,603 B2 | 4/2014 | Sills |
| 8,958,228 B2 | 2/2015 | Samachisa et al. |
| 8,969,154 B2 | 3/2015 | Sandhu |
| 9,112,046 B2 | 8/2015 | Sandhu |
| 9,177,872 B2 | 11/2015 | Sandhu |
| 9,356,155 B2 | 5/2016 | Sandhu |
| 9,397,145 B1 | 7/2016 | Sills et al. |
| 9,698,272 B1* | 7/2017 | Ikeda ............... G11C 11/4097 |
| 2002/0028568 A1 | 3/2002 | Ueno et al. |
| 2002/0125535 A1 | 9/2002 | Ueda |
| 2003/0107044 A1* | 6/2003 | Kubota ............ H01L 21/76838 257/79 |
| 2003/0122140 A1* | 7/2003 | Yamazaki ............... H01L 51/56 257/88 |
| 2003/0234414 A1 | 12/2003 | Brown |
| 2005/0104068 A1 | 5/2005 | Yamazaki |
| 2005/0236671 A1* | 10/2005 | Schuele ................ H01L 27/12 257/347 |
| 2005/0270830 A1 | 12/2005 | Tuttle |
| 2006/0065927 A1 | 3/2006 | Thean et al. |
| 2006/0175609 A1* | 8/2006 | Chan ................ H01L 29/78642 257/59 |
| 2006/0220087 A1 | 10/2006 | Fishbum |
| 2008/0237687 A1 | 10/2008 | Kim et al. |
| 2008/0251825 A1 | 10/2008 | Lee |
| 2009/0008631 A1* | 1/2009 | Hurkx ............... H01L 29/0676 257/25 |
| 2010/0025678 A1 | 2/2010 | Yamazaki et al. |
| 2010/0051949 A1 | 3/2010 | Yamazaki et al. |
| 2010/0084649 A1* | 4/2010 | Seo ..................... H01L 29/7869 257/43 |
| 2010/0140614 A1 | 6/2010 | Uchiyama et al. |
| 2010/0295120 A1 | 11/2010 | Sandhu et al. |
| 2010/0301325 A1* | 12/2010 | Bae ................... H01L 29/78696 257/43 |
| 2011/0097842 A1 | 4/2011 | Yang et al. |
| 2011/0108833 A1 | 5/2011 | Yamazaki et al. |
| 2011/0133248 A1 | 6/2011 | Chen et al. |
| 2011/0140195 A1 | 6/2011 | Zahurak et al. |
| 2011/0156025 A1 | 6/2011 | Shionoiri et al. |
| 2011/0215328 A1* | 9/2011 | Morosawa ............. H01L 29/786 257/59 |
| 2011/0250745 A1 | 10/2011 | Millward et al. |
| 2012/0132914 A1 | 5/2012 | Chen |
| 2012/0161126 A1 | 6/2012 | Yamazaki |
| 2012/0286259 A1 | 11/2012 | Park et al. |
| 2013/0069052 A1* | 3/2013 | Sandhu .............. H01L 21/8254 257/43 |
| 2013/0134415 A1* | 5/2013 | Godo ................. H01L 29/7869 257/43 |
| 2013/0228926 A1 | 9/2013 | Maeda et al. |
| 2013/0277670 A1 | 10/2013 | Isobe |
| 2014/0021485 A1 | 1/2014 | Cho |
| 2014/0027839 A1* | 1/2014 | Kim ..................... G11C 11/412 257/329 |
| 2014/0091303 A1* | 4/2014 | Yamazaki ........... H01L 27/1225 257/43 |
| 2014/0361239 A1* | 12/2014 | Ramaswamy et al. |
| 2015/0021591 A1* | 1/2015 | Kim .................... H01L 29/7869 257/43 |
| 2015/0069320 A1 | 3/2015 | Rabkin et al. |
| 2015/0091058 A1 | 4/2015 | Doyle et al. |
| 2015/0243562 A1* | 8/2015 | Sunamura ............. H01L 27/092 438/104 |
| 2015/0287745 A1 | 10/2015 | Kato |
| 2015/0372104 A1 | 12/2015 | Liu et al. |
| 2015/0372135 A1 | 12/2015 | Park |
| 2016/0049406 A1 | 2/2016 | Sandhu |
| 2016/0141419 A1 | 5/2016 | Baenninger et al. |
| 2016/0197099 A1 | 7/2016 | Sasaki |
| 2016/0315196 A1* | 10/2016 | Barlage ............. H01L 21/02554 |
| 2017/0104014 A1* | 4/2017 | Sasaki ............... H01L 29/41733 |
| 2019/0237556 A1* | 8/2019 | Tsu ....................... H01L 27/146 |
| 2019/0348540 A1* | 11/2019 | Pillarisetty ........... H01L 29/775 |
| 2020/0266304 A1 | 8/2020 | Ueoka et al. |

FOREIGN PATENT DOCUMENTS

| | | |
|---|---|---|
| JP | 2008-515224 | 4/2006 |
| JP | 2010-177450 A | 8/2010 |
| JP | 2012-064934 | 3/2012 |
| JP | 2012-119664 | 6/2012 |
| JP | 2012-151461 | 8/2012 |
| JP | 2013-125917 | 6/2013 |
| JP | 2014-045009 A | 3/2014 |
| JP | 2015-111663 A | 6/2015 |
| JP | 2013-077815 | 10/2015 |
| KR | 10-0882677 B1 | 2/2009 |
| KR | 10-2012-0015963 A | 2/2012 |
| KR | 10-2013-0073843 A | 7/2013 |
| KR | 10-2014-0011570 A | 1/2014 |

OTHER PUBLICATIONS

International Search Report from International Application No. PCT/US2018/048936, dated Dec. 21, 2018, 3 pages.

Yoon et al., A Novel Low Leakage Current VPT (Vertical Pillar Transistor) Integration for 4F2 DRAM Cell Array with Sub 40 nm Technology, 2006 64th Device Research Conference, (Jun. 26-28, 2006), pp. 259-260.

Wager et al., Thin, Fast, and Flexible Semiconductors, IEEE Spectrum, (Apr. 28, 2011), 5 pages.

Song et al., Short Channel Characteristics of Gallium-Indium-Zinc-Oxide Thin Film Transistors for Three-Dimensional Stacking Memory, IEEE Electron Device Letters, vol. 29, No. 6, (Jun. 2008), pp. 549-552.

Sasago et al., Cross-Point Phase Change Memory with 4F2 Cell Size Driven by Low-Contact-Resistivity Poly-Si Diode, 2009 Symposium on VLSI Technology Digest of Technical Papers, (2009), pp. 24-25.

Munzenrieder et al., Room Temperature Fabricated Flexible NiO/IGZO pn Diode Under Mechanical Strain, Solid-State Electronics, vol. 87, (2013), pp. 17-20.

Matsuzaki et al., 1Mb-Volatile Random Access Memory Using Oxide Semiconductor, 2011 3rd IEEE International Memory Workshop (IMW), (May 22-25, 2011, 4 pages.

Li et al., Novel Schottky Barrier MOSFET with Dual-Layer Silicide Source/Drain Structure, Proceedings. 7th International Conference on Solid-State and Integrated Circuits Technology, Oct. 18-21, 20104, pp. 69-72.

Kurweil Accelerting Intelligence, News, Ultra-Low-Power Transistors Could Function for Yeast Without a Battery, http://www.kurzweilai.net/ultra-low-power-transistors-could-function-for-years-without-a-battery, (Oct. 25, 2016), 2 pages.

Kumomi et al., Materials, Devices, and Circuits of Transparent Amorphous-Oxide Semiconductor, Journal of Display Technology, vol. 5, No. 12, (Dec. 2009), pp. 531-540.

Kim et al., High Performance PRAM Cell Scalable to Sub-20nm Technology with Below 4F2 Cell Size, Extendable to DRAM Applications, 2010 Symposium on VLSI Technology Digest of Technical Papers, (2010), pp. 203-204.

(56) References Cited

OTHER PUBLICATIONS

Kaczmarski et al., Transparent Amorphous Ru—Si—O Schottky COntacts to In—Ga—Zn—O, Journal of Display Technology, vol. 11, Issue 6, p. 528.
Kaczmarski et al., Revising Ru—Si—O as a Nanocrystalline Schottky Electrode for Oxide Semiconductors, 2016 International School and Conference of Physics of Semiconductors, Jun. 21, 2016, 1 page.
Hofmann et al., Surrounding Gate Select Transistor for 4F2 Stacked Gbit DRAM, 31st European Solid-State Device Research Conference, Sep. 11-13, 2001, 4 pages.
Fung et al., Two Dimensional Numerical Simulation of Radio Frequency Sputter Amorphous In—Ga—Zn—O Thin-Film Transistors, Journal of Applied Physics, vol. 106, (2009), 084511-1-084511-10.
Choi et al., A Transparent Diode with High Rectifying Ratio Using Amorphous Indium-Gallium-Zinc Oxide/SiNx Coupled Junction, Applied Physics Letters, vol. 107, (2015), pp. 053501-01-053501-4.
Liang et al., Cross-Point Memory Array Without Cell Selectors—Device Characteristics and Data Storage Pattern Dependencies, IEEE Transactions on Electron Devices, vol. 57, No. 10, (Oct. 2010), pp. 2531-2538.
Japanese First Office Action for Application No. 2020-508040, dated May 25, 2021, 5 pages.
Japanese Notice of Rejection Ground for Application No. 2020-508381, dated Apr. 27, 2021, 13 pages.
Korean Second Office Action for Application No. 10-2020-7008922, dated Jun. 25, 2021, 8 pages.
Supplementary Partial European Search Report for Application No. EP 18 85 0240, dated Apr. 30, 2021, 11 pages.
Korean Notice of Reasons for Rejection for Application No. 10-2020-7008246, dated Feb. 22, 2021, 12 pages.
European Search Report and Search Opinion Received for EP Application No. 18850240, dated Aug. 2, 2021, 10 pages.
Korean Notice of Allowance for Application No. 10-2020-7008246, dated Aug. 25, 2021, 4 pages.
Japanese Second Office Action for Application No. 2020-508040, dated Jan. 5, 2022, 11 pages.

\* cited by examiner

SEMICONDUCTOR DEVICES, TRANSISTORS, AND RELATED METHODS FOR CONTACTING METAL OXIDE SEMICONDUCTOR DEVICES

CROSS-REFERENCE TO RELATED APPLICATION

This application claims the benefit under 35 U.S.C. § 119(e) of U.S. Provisional Patent Application Ser. No. 62/552,809, filed Aug. 31, 2017, the disclosure of which is hereby incorporated herein in its entirety by this reference.

TECHNICAL FIELD

The present disclosure, in various embodiments, relates generally to the field of memory device design and fabrication. More particularly, this disclosure relates to the design and fabrication of memory cells and devices, to such cells and to systems incorporating such cells.

BACKGROUND

Transistors may be utilized in a variety of different semiconductor devices. For example, a transistor utilized in a memory cell may be referred to in the art as an "access transistor." The transistor conventionally includes a channel region between a pair of source/drain regions and a gate configured to electrically connect the source/drain regions to one another through the channel region. The channel region is usually formed of a semiconductor material; however, other materials have also been used.

To charge, discharge, read, or recharge the capacitor, the transistor may be selectively turned to an "on" state, in which current flows between the source and drain regions through the channel region of the transistor. The transistor may be selectively turned to an "off" state, in which the flow of current is substantially halted. Ideally, in the off state, the capacitor would retain, without change, its charge. However, capacitors of conventional volatile memory cells experience discharges of current over time. Therefore, even in the "off" state, a conventional volatile memory cell will often still undergo some flow of current from the capacitor. This off-state leakage current is known in the industry as a sub-threshold leakage current.

To account for the sub-threshold leakage current and to maintain the capacitor of the memory cell at an appropriate charge to correspond to its intended logical value, conventional volatile memory cells are frequently refreshed. The sub-threshold leakage current can also impact the fabrication and configuration of an array of memory cells within a memory device. Sub-threshold leakage current rates, refresh rates, cell size, and thermal budgets of memory cells are often important considerations in the design, fabrication, and use of volatile memory cells and arrays of cells incorporated in memory devices.

DETAILED DESCRIPTION

Figure 1A:
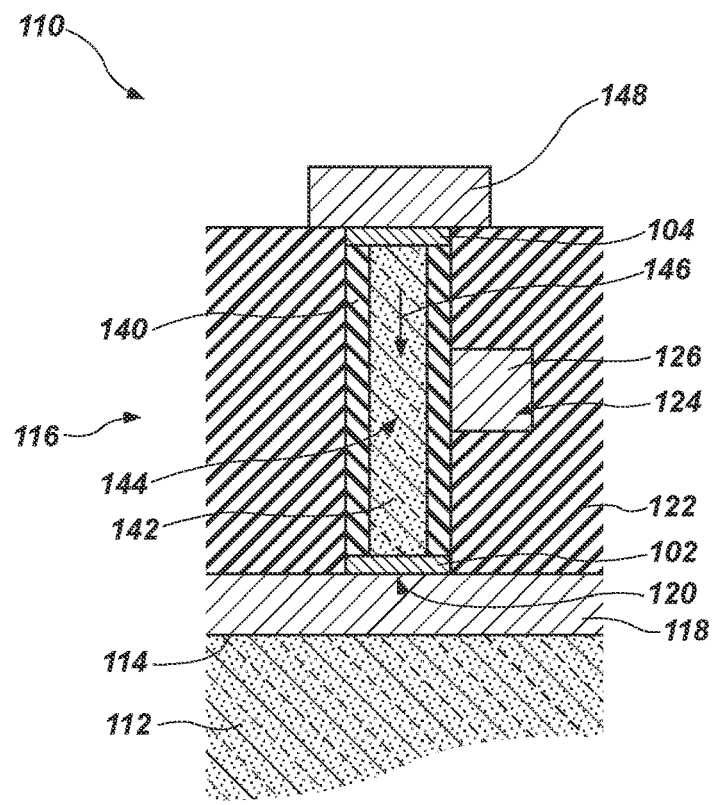
FIG. 1A is a cross-sectional front view of a schematic of a transistor according to an embodiment of the present disclosure.

Thin film transistors are disclosed, such as may be incorporated in memory structures, memory cells, arrays including such memory cells, memory devices, switching devices, and other semiconductor devices including such arrays, systems including such arrays, and methods for fabricating and using such memory structures are also disclosed. Embodiments of the disclosure include a variety of different memory cells (e.g., volatile memory, non-volatile memory) and/or transistor configurations. Non-limiting examples include random-access memory (RAM), read only memory (ROM), dynamic random access memory (DRAM), synchronous dynamic random access memory (SDRAM) flash memory, resistive random access memory (ReRAM), conductive bridge random access memory (conductive bridge RAM), magnetoresistive random access memory (MRAM), phase change material (PCM) memory, phase change random access memory (PCRAM), spin-torque-transfer random access memory (STTRAM), oxygen vacancy-based memory, programmable conductor memory, ferroelectric random access memory (FE-RAM), reference field-effect transistors (RE-FET), etc.

Some memory devices include memory arrays exhibiting memory cells arranged in a cross-point architecture including conductive lines (e.g., access lines, such as word lines) extending perpendicular (e.g., orthogonal) to additional conductive lines (e.g., data lines, such as bit lines). The memory arrays can be two-dimensional (2D) so as to exhibit a single deck (e.g., a single tier, a single level) of the memory cells, or can be three-dimensional (3D) so as to exhibit multiple decks (e.g., multiple levels, multiple tiers) of the memory cells. Select devices can be used to select particular memory cells of a 3D memory array. Embodiments additionally may include thin field transistors utilized in non-access device implementations. Non-limiting examples of which include deck selector devices, back end of line (BOEL) routing selector devices, etc.

Embodiments of the present disclosure may include different configurations of transistors (e.g., thin film transistors (TFT)), including vertically oriented transistors, horizontally oriented transistors (i.e., planar), etc. The memory cells include access transistors having channel regions formed with an oxide semiconductor material. For example, in some embodiments the channel region may be formed with an amorphous oxide semiconductor. Non-limiting examples may include ZTO, IZO, $ZnO_x$, IGZO, $InO_x$, $In_2O_3$, $SnO_2$, $TiO_x$, $Zn_xO_yN_z$, $Mg_xZn_yO_z$, $In_xZn_yO_z$, $In_xGa_yZn_zO_a$, $Zr_xIn_yZn_zO_a$, $Hf_xIn_yZn_zO_a$, $Sn_xIn_yZn_zO_a$, $Al_xSn_yIn_zZn_aO_d$, $Si_xIn_yZn_zO_a$, $Zn_xSn_yO_z$, $Al_xZn_ySn_zO_a$, $Ga_xZn_ySn_zO_a$, $Zr_xZn_ySn_zO_a$, InGaSiO, and other similar materials.

The transistors include source contacts and/or drain contacts that are formed from materials that form a non-Schottky interface with the channel material as opposed to a Schottky interface having a barrier oxide. Memory cells having access transistors with channel regions formed of an oxide semiconductor material may accommodate high cell and device packing densities and refreshing of the cells relatively infrequently. The structures of embodiments of the present disclosure may be formed at relatively low temperatures, making the present structures conducive for fabrication in stacked array structures, including cross-point memory array structures.

As used herein, the term "substrate" means and includes a base material or construction upon which components, such as those within memory cells, are formed. The substrate may be a semiconductor substrate, a base semiconductor layer on a supporting structure, a metal electrode, or a semiconductor substrate having one or more layers, structures, or regions formed thereon. While materials described and illustrated herein may be formed as layers, the materials are not limited thereto and may be formed in other three-dimensional configurations. The substrate may be a conventional silicon substrate or other bulk substrate including a layer of semiconductive material. As used herein, the term "bulk substrate" means and includes not only silicon wafers, but also silicon-on-insulator ("SOT") substrates, such as silicon-on-sapphire ("SOS") substrates or silicon-on-glass ("SOG") substrates, epitaxial layers of silicon on a base semiconductor foundation or other semiconductor or optoelectronic materials, such as silicon-germanium ($Si_{1-x}Ge_x$, where x may be, for example, a mole fraction between 0.2 and 0.8), germanium (Ge), gallium arsenide (GaAs), gallium nitride (GaN), or indium phosphide (InP). The substrate may be doped or may be undoped. Furthermore, when reference is made to a "substrate" in the following description, previous process stages may have been utilized to form regions or junctions in the base semiconductor structure or foundation.

As used herein, spatially relative terms, such as "beneath," "below," "lower," "bottom," "above," "upper," "top," "front" "rear," "left," "right," and the like, may be used for ease of description to describe one element or feature's relationship to another element(s) or feature(s) as illustrated in the figures. Unless otherwise specified, the spatially relative terms are intended to encompass different orientations of the device in use or operation in addition to the orientation depicted in the figures. For example, if a device in the figures is turned over, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The device may be otherwise oriented (rotated 90 degrees or at other orientations) and the spatially relative descriptors used herein interpreted accordingly. In addition, reference to an element as being "on" or "over" another element means and includes the element being directly on top of, adjacent to, underneath, or in direct contact with the other element. It also includes the element being indirectly on top of, adjacent to, underneath, or near the other element, with other elements present therebetween. In contrast, when an element is referred to as being "directly on" another element, there are no intervening elements present.

As used herein, the singular forms "a," "an," and "the" are intended to include the plural forms as well, unless the context clearly indicates otherwise. In addition, it should be understood that any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. Also, unless stated otherwise a set of elements may comprise one or more elements.

As used herein, "and/or" includes any and all combinations of one or more of the associated listed items.

As used herein, the term "configured" refers to a size, shape, material composition, and arrangement of one or more of at least one structure and at least one apparatus facilitating operation of one or more of the structure and the apparatus in a pre-determined way.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, or even at least 99.9% met.

The illustrations presented herein are not meant to be actual views of any particular component, structure, device, or system, but are merely representations that are employed to describe embodiments of the present disclosure. Embodiments are described herein with reference to cross-sectional illustrations that are schematic illustrations. Accordingly, variations from the shapes of the illustrations as a result, for example, of manufacturing techniques and/or tolerances, are to be expected. Thus, embodiments described herein are not to be construed as limited to the particular shapes or regions as illustrated but include deviations in shapes that result, for example, from manufacturing. For example, a region illustrated or described as box shape may, typically, have rough and/or nonlinear features. Moreover, sharp angles that are illustrated may be rounded. Thus, the regions illustrated in the figures are schematic in nature and their shapes are not intended to illustrate the precise shape of a region and do not limit the scope of the present claims. Reference will now be made to the drawings, where like numerals refer to like components throughout. The drawings are not necessarily drawn to scale or proportionally for the different materials.

The following description provides specific details, such as material types and processing conditions, in order to provide a thorough description of embodiments of the disclosed devices and methods. However, a person of ordinary skill in the art will understand that the embodiments of the devices and methods may be practiced without employing these specific details. Indeed, the embodiments of the devices and methods may be practiced in conjunction with conventional semiconductor fabrication techniques employed in the industry.

The fabrication processes described herein do not form a complete process flow for processing semiconductor device structures. The remainder of the process flow is known to those of ordinary skill in the art. Accordingly, only the methods and semiconductor device structures necessary to understand embodiments of the present devices and methods are described herein. Unless the context indicates otherwise, the materials described herein may be formed by any suitable technique including, but not limited to, spin coating, blanket coating, chemical vapor deposition ("CVD"), atomic layer deposition ("ALD"), plasma enhanced ALD, or physical vapor deposition ("PVD"). Alternatively, the materials may be grown in situ. Depending on the specific material to be formed, the technique for depositing or growing the material may be selected by a person of ordinary skill in the art. Unless the context indicates otherwise, the removal of materials described herein may be accomplished by any suitable technique including, but not limited to, etching, abrasive planarization, or other known methods.

A memory cell is disclosed. The memory cell comprises a transistor and a storage element operatively coupled with the transistor. The transistor includes a gate electrode, a drain region including a drain contact, a source region including a source contact, a channel region comprising an oxide semiconductor material operatively coupled with the drain contact and the source contact, and at least one of the drain contact or the source contact comprises a material that forms a non-Schottky interface with the channel material.

Figure 1B:
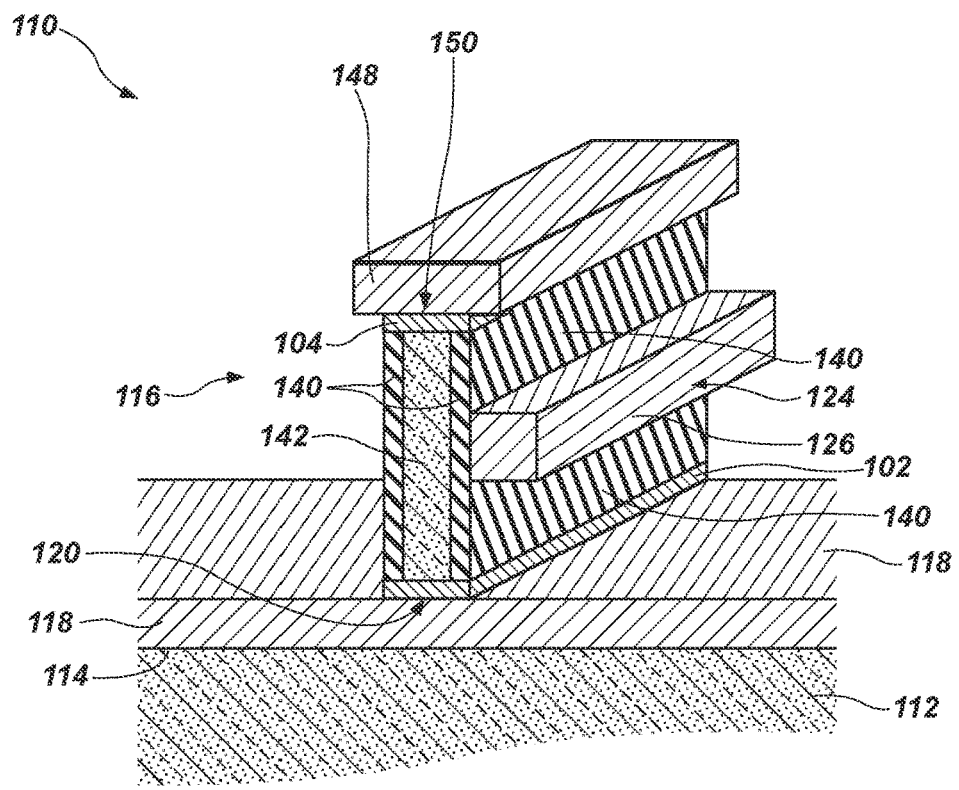
FIG. 1B is a cross-sectional perspective view of the schematic of FIG. 1A.

FIG. 1A is a cross-sectional front view of a schematic of thin film transistor 116 according to an embodiment of the present disclosure. FIG. 1B is a cross-sectional perspective view of the thin film transistor 116 of FIG. 1A (for ease of illustration, first insulative material 122 is not depicted in FIG. 1B). FIG. 1A and FIG. 1B will be referred to together herein. In some embodiments, the transistor 116 incorporated within a memory structure. For example, the transistor 116 may be an access transistor incorporated within a memory cell that includes a storage element coupled to the transistor 116 to enable a read and/or write operation of a charge stored in the storage element. The storage element may be configured according to a variety of storage elements (e.g., a capacitor) known in the art. For example, the transistor 116 may be incorporated as an access transistor or other selector device within a memory device (e.g., a resistance variable memory device, such as a RRAM device, a CBRAM device, an MRAM device, a PCM memory device, a PCRAM device, a STTRAM device, an oxygen vacancy-based memory device, and/or a programmable conductor memory device), such as in a 3D cross-point memory array.

The transistor 116 includes a source region 120, a drain region 150, and a channel region 144 supported by a substrate 112. The channel region 144 may extend from the primary surface 114 of the substrate 112 substantially vertically. In other words, the transistor 116 may be a vertical access transistor (i.e., a transistor in a vertical orientation). The channel region 144 includes a channel material 142 disposed between a source contact 102 of the source region 120 and a drain contact 104 of the drain region 150. As a result, the channel region 144 is in operative connection with both the source region 120 and the drain region 150. The channel material 142 forming the channel region 144 of the transistor 116 may also be supported by the substrate 112. The channel material 142 may be formed with an oxide semiconductor material. For example, in some embodiments the channel region may be formed with an amorphous oxide semiconductor. Non-limiting examples may include ZTO, IZO, $ZnO_x$, IGZO, $InO_x$, $In_2O_3$, $SnO_2$, $TiO_x$, $Zn_xO_yN_z$, $Mg_xZn_yO_z$, $In_xZn_yO_z$, $In_xGa_yZn_zO_a$, $Zr_xIn_yZn_zO_a$, $Hf_xIn_yZn_zO_a$, $Sn_xIn_yZn_zO_a$, $Al_xSn_yIn_zZn_aO_d$, $Si_xIn_yZn_zO_a$, $Zn_xSn_yO_z$, $Al_xZn_ySn_zO_a$, $Ga_xZn_ySn_zO_a$, and $Zr_xZn_ySn_zO_a$, InGaSiO, and other similar materials.

As discussed above, the source region 120 includes the source contact 102 disposed between the channel region 144 and the substrate 112 such that the source region 120 and the channel region 144 are operably coupled. The source region 120 may also include a first conductive material 118 disposed on a substrate 112 proximate to a primary surface 114 of the substrate 112. In some embodiments, the first conductive material 118 may be disposed across the majority (e.g., entirety) of the primary surface 114 of the substrate 112. Alternatively, the first conductive material 118 may be formed within the substrate 112, with an upper surface of the first conductive material 118 occupying the same plane defined by the primary surface 114 of the substrate 112. In some embodiments, one or more barrier materials may be provided between the first conductive material 118 and the substrate 112.

The source contact 102 may be in direct contact, at least partially, with the channel material 142. The source contact 102 may be formed from a material that, in turn, forms a non-Schottky interface with the channel material 142 rather than a barrier oxide. In other words, the combination of the channel material 142 and the source contact 102 may reduce the Schottky barrier effects typically present in conventional memory cells. As a result, the drive current may be increased at a lower $V_{DS}$. For example, contact between the source contact 102 and the channel material 142 may form a conductive oxide as its non-Schottky interface. In some embodiments, the source contact 102 may be formed from Ruthenium (Ru). The interface formed by the channel material 142 and a Ru source contact 102 may be a Ru oxide, which is conductive. In other embodiments, the source contact 102 may be formed from indium tin oxide (ITO) or other material that forms a non-Schottky interface when in combination with the selected channel material 142. The interface formed by the channel material 142 and an ITO source contact 102 may be an ITO oxide, which is conductive. In another embodiment, contact between the source contact 102 and the channel material 142 may form an interface that reduces (e.g., eliminates) any interfacial oxide for its non-Schottky interface when the source contact 102 is in contact with the oxide semiconductor material of the channel material 142. These examples are in contrast to conventional memory cells that include materials (e.g., W) that oxidize with the channel region to form a Schottky barrier for the source region. For example, when the Ru is used as the source contact 102, the interfacial oxide may be reduced because Ru may have a weaker affinity for oxygen, in comparison to a conventional contact materials, such as W, in which oxygen migrates from the channel material 142 into the W, and In and Zn concentrations decrease in the vicinity of the W interface. As a result, the interface between Ru and the channel region 144 may be sharper in comparison to the more diffused interface between W and the channel region 144.

The drain region 150 includes the drain contact 104 disposed on the channel region 144 such that the drain region 150 and the channel region 144 are operably coupled. The drain region 150 may also include a second conductive material 148. In embodiments in which the channel region 144 is vertically disposed relative to the primary surface 114 of the substrate 112, the drain contact 104 and the second conductive material 148 may be formed atop the channel region 144.

The drain contact 104 may be in direct contact, at least partially, with the channel material 142. Like the source contact 102, the drain contact 104 may be formed from a material that, in turn, forms a non-Schottky interface with the channel material 142 rather than a barrier oxide. In some embodiments, the drain contact 104 may be formed from Ruthenium (Ru). In other embodiments, the drain contact 104 may be formed from indium tin oxide (ITO) or other material that forms a conductive oxide in combination with the selected channel material 142. For example, contact between the drain contact 104 and the channel material 142 may form a conductive oxide as its non-Schottky interface. In some embodiments, the drain contact 104 may be formed from Ruthenium (Ru). The interface formed by the channel material 142 and a Ru drain contact 104 may be a Ru oxide, which is conductive. In other embodiments, the drain contact 104 may be formed from indium tin oxide (ITO) or other material that forms a non-Schottky interface when in combination with the selected channel material 142. The interface formed by the channel material 142 and an ITO drain contact 104 may be an ITO oxide, which is conductive. In another embodiment, contact between the drain contact 104 and the channel material 142 may form an interface that reduces (e.g., eliminates) any interfacial oxide for its non-Schottky interface when the drain contact 104 is in contact with the oxide semiconductor material of the channel material 142. These examples are in contrast to conventional memory cells that include materials (e.g., tungsten) that oxidize with the channel region to form a Schottky barrier for the source region.

Figure 4:
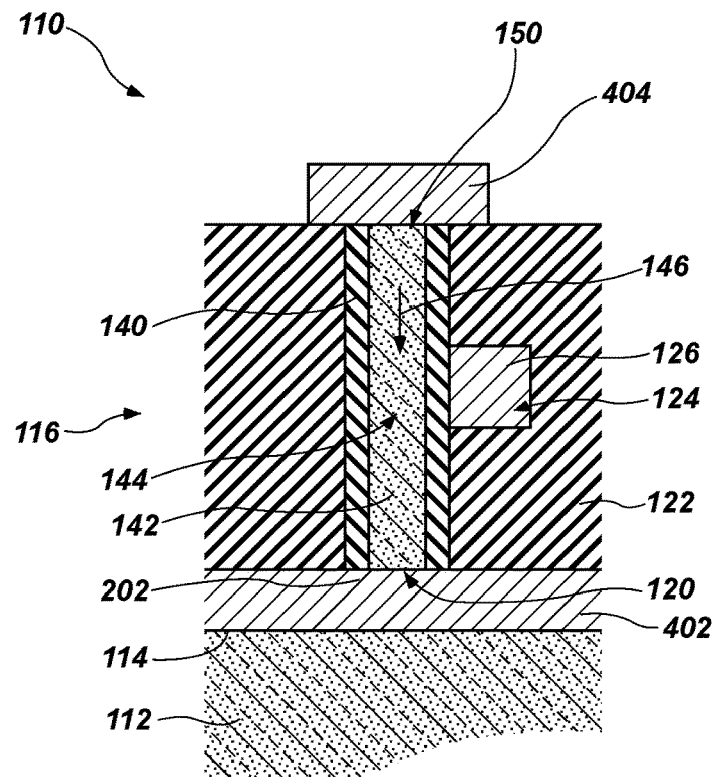

The second conductive material 148 may be provided in lines parallel with the third conductive material 124 of the gate electrode 126. The second conductive material 148 may be formed in aligned segments (for example, as shown in FIG. 4), as, for example, when more than one memory cell 110 is to be formed of the second conductive material 148. Each aligned segment of the second conductive material 148 may form a drain region 150 of a separate memory cell 110. Segmentation of the second conductive material 148 may provide electrical isolation of each segment of second conductive material 148 from one another.

Each of the first conductive material 118 and the second conductive material 148 may be formed of one metal, of a mixture of metals, or of layers of different metals. For example, without limitation, the first conductive material 118 and/or the second conductive material 148 may be formed of titanium nitride, copper, tungsten, tungsten nitride, molybdenum, other conductive materials, and any combination thereof. In some embodiments, the conductive materials 118, 148 may be formed from a doped semiconductor material (e.g., doped poly-silicon).

The channel material 142 may further be situated at least partially within a first insulative material 122 as shown in FIG. 1A (not shown in FIG. 1B). The first insulative material 122 may surround and support the channel material 142. The first insulative material 122 may be a conventional interlayer dielectric material. A second insulative material 140 may be provided along sidewalls of the channel material 142 and may isolate the channel material 142 from a gate electrode 126 formed of a third conductive material 124. The second insulative material 140 may be formed of a conventional gate insulator material, such as an oxide (e.g., silicon dioxide). The third conductive material 124 of the gate electrode 126 may be formed from one metal, from a mixture of metals, or from layers of different metals. For example, without limitation, the third conductive material 124 of the gate electrode 126 may be formed of titanium nitride. A barrier material (not shown) may be provided between the gate electrode 126 and surrounding components. The third conductive material 124 forming the gate electrode 126 may be isolated from the first conductive material 118 by the first insulative material 122.

The gate electrode 126 is configured to operatively interconnect with the channel region 144 to selectively allow current to pass through the channel region 144 when the transistor 116 is enabled (i.e., "on"). However, when the transistor 116 is disabled (i.e., "off"), current may leak from the drain region 150 to the source region 120 as indicated by arrow 146. The gate electrode 126 may be configured as an access line (e.g., a word line) arranged perpendicular to the first conductive material 118, which may be configured as a data/sense line (e.g., a bit line).

A storage element (not shown) may be in operative communication with the transistor 116 to form a memory cell. Different configurations of storage elements are contemplated as known by those skilled in the art. For example, storage elements (e.g., capacitors) may be configured as container structures, planar structures, etc. Accordingly, a memory cell is disclosed. The memory cell comprises a transistor that comprises a source region, a drain region, and a channel region comprising an oxide semiconductor material disposed between a source contact of the source region and a drain contact of the drain region. The source contact and the drain contact may be formed from a material that, in turn, forms a non-Schottky interface with the channel material 142 rather than a barrier oxide as discussed above. The memory cell further comprises a storage element in operative communication with the transistor.

A method of operating the transistor 116 is also disclosed. In operation, the transistor 116 may be selectively turned to an "on" state (i.e., enabled) to allow current to pass from the source region 120 to the drain region 150 through the channel region 144. The transistor 116 may also be selectively turned to an "off" state (i.e., disabled) to substantially stop current from passing through the channel region 144. When incorporated with a select device, enabling or disabling the transistor 116 may connect or disconnect to a desired structure. When incorporated as an access transistor, the transistor 116 may enable access to the storage element during a particular operation (e.g., read, write, etc.). However, current may "leak" from the storage element through the channel region 144 in the "off" state in the direction of arrow 146 and/or in other directions. Refreshing the memory cell may include reading and recharging each memory cell to restore the storage element to a charge corresponding to the appropriate binary value (e.g., 0 or 1).

As shown in FIGS. 1A and 1B, the source contact 102 may be disposed on top of the first conductive material 118 such that the source contact 102 protrudes from the primary surface of the first conductive material 118 to contact the channel material 142. The drain contact 104 may be disposed on top of the channel material 142. The source contact 102 and the drain contact 104 may extend along the entirety of the respective end of the channel material 142. As a result, the source contact 102 and a first end of the channel material 142 may form a non-Schottky interface, and the drain contact 104 and a second end of the channel material 142 may form a non-Schottky interface. In some embodiments, only one of the source or drain may include a contact that provides for a non-Schottky interface. For example, some embodiments may include the source contact 102 but not the drain contact 104, or vice versa. Thus, the first interface may form a non-Schottky interface and the second interface may form a barrier oxide (i.e., Schottky interface). Additional configurations are also contemplated.

Figure 2:
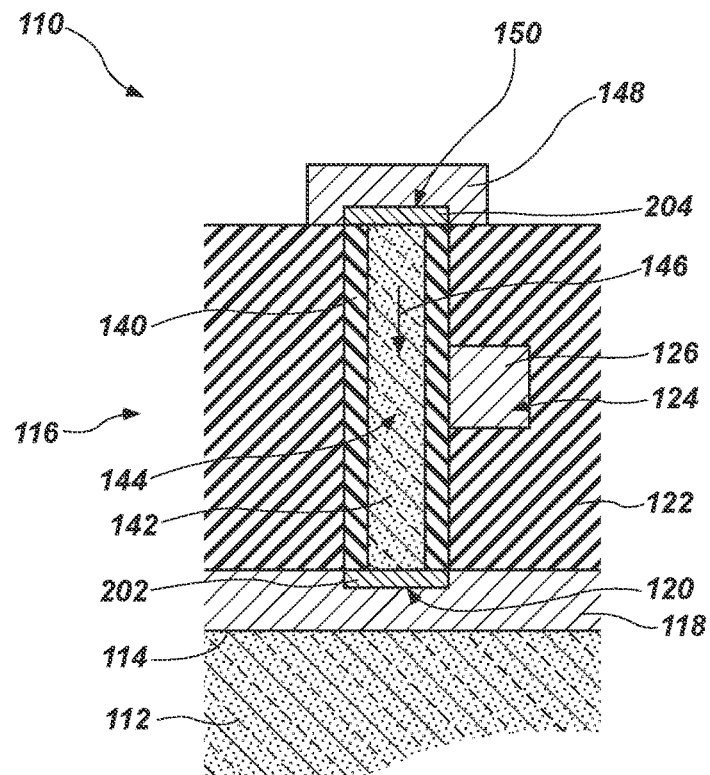
FIGS. 2 to 5 are cross-sectional front views of a schematic of vertical thin film transistor according to various embodiments of the present disclosure.

For example, as shown in FIG. 2, the source contact 202 may be at least partially embedded (e.g., as an insert) within first conductive material 118 and below the channel material 142. The drain contact 204 may also be at least partially embedded within second conductive material 148. In other words, the second conductive material 148 may be formed to at least partially surrounding the drain contact 104 on multiple sides.

Figure 3:
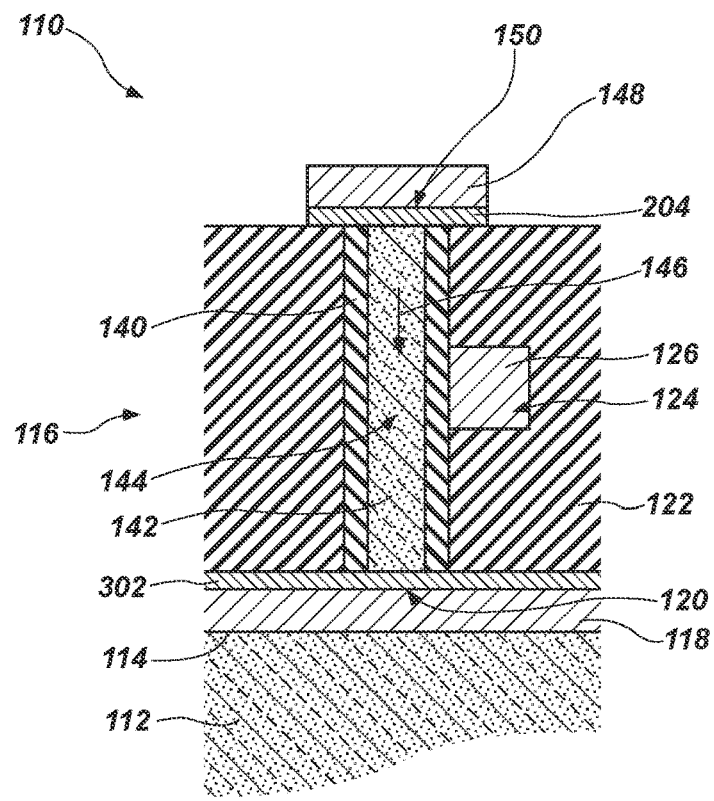

As shown in FIG. 3, the source contact 302 disposed on the first conductive material 118 is coextensive with the first conductive material 118. As a result, the source contact 302 may be shared with at least one neighboring memory cell of a larger memory array. For example, the material used for the source contact 302 may be deposed continuously along the entirety of the first conductive material 118 in some embodiments.

As shown in FIG. 4, the memory cell 110 may not include a first conductive material or a second conductive material. In such an embodiment, the source contact 402 may be configured to replace the first conductive material of the other embodiments, and the drain contact 404 may be configured to replace the second conductive material of the other embodiments. In other words, material used for the source contact 402 may be used for the data/sense line (e.g., bit line). Likewise, the material used for the drain contact 404 may be used for the drain region 150.

Figure 5:
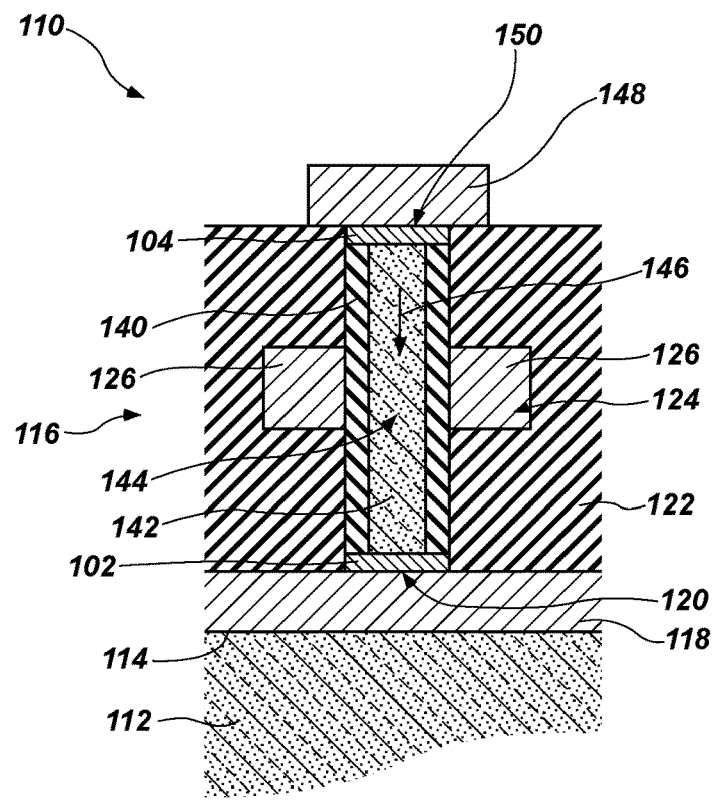

As shown in FIGS. 1A, 1B, and 2 through 4, the gate electrode 126 may include a single-side gate passing along one of the sidewalls of the channel material 142. Other configurations are also contemplated. For example, as shown in FIG. 5, the gate electrode 126 may include a dual-sided gate with electrodes provided along at least a part of each of the sidewalls of the channel material 142. In some embodiments, the gate electrode 126 may include a tri-sided gate with electrodes provided along at least a part of each of the sidewalls and front wall or rear wall of the channel material 142. Therefore, the gate electrode 126 may be configured as a "U" gate. In still other embodiments, the gate electrode 126 may include a surround gate conformally covering each of the sidewalls, front wall, and rear wall of the channel material 142. In still other embodiments, the gate electrode 126 may include a ring gate surrounding only a portion of each of the sidewalls, front wall, and rear wall of the channel material 142. Forming the various configurations of the gate electrode 126 may be achieved according to techniques known in the art. Therefore, details for forming these other configurations are not provided herein.

Figure 6:
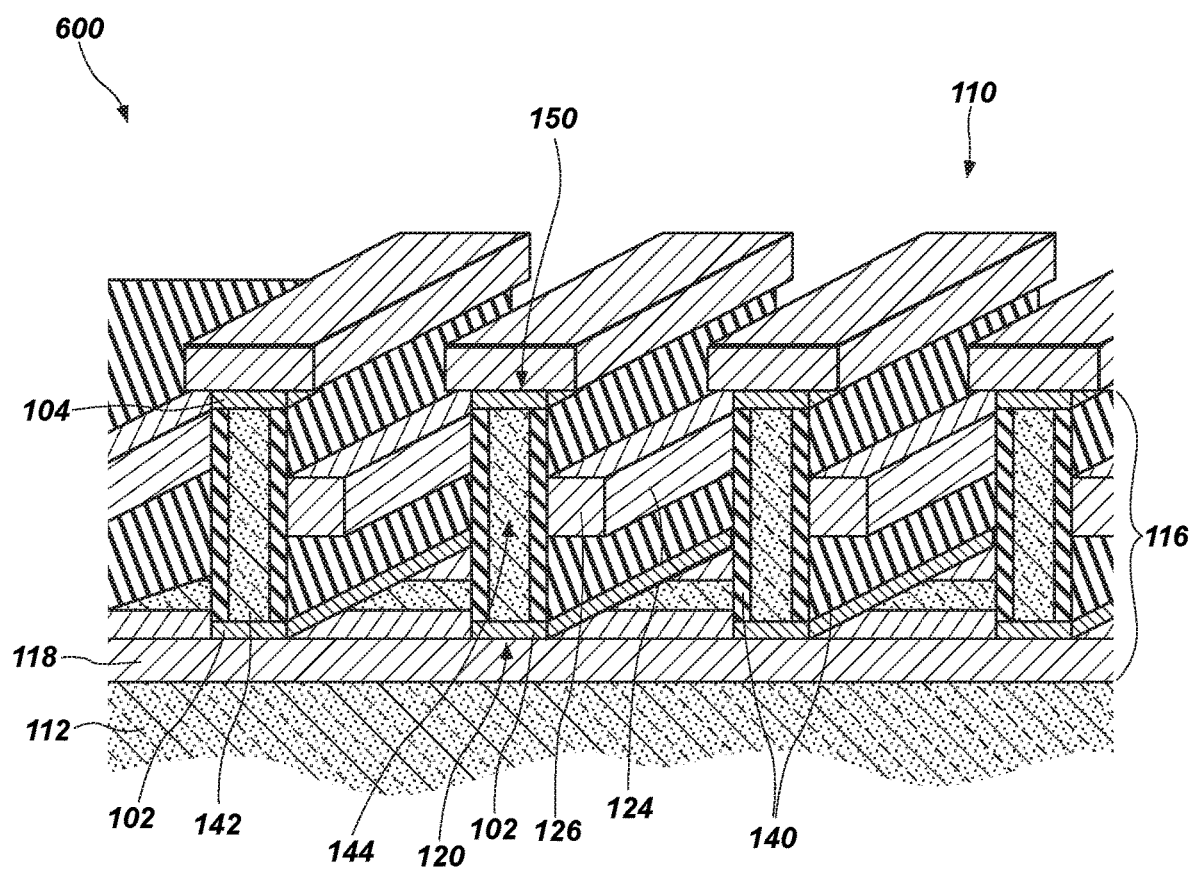
FIG. 6 is a perspective view of a schematic of an array according to an embodiment of the present disclosure.

FIG. 6 is a perspective view of a schematic of transistors 116 that may be utilized as access transistors for a memory array 600 according to an embodiment of the present disclosure. The transistors 116 may be coupled to a corresponding storage element (not shown for convenience) to form a memory cell. As discussed above, various configurations of storage elements are contemplated as would be apparent to those of ordinary skill in the art. Each memory cell 110 defines a cell area according to the dimensions of its sides. Each side may have a cell side dimension. The cell may have equal width and length cell side dimensions. The dimensions of the capacitor of each memory cell 110 may be relatively small and the memory cells 110 densely packed relative to one another. In some embodiments, cell side dimension of each memory cell 110 of the present disclosure may be substantially equal to or less than 2F, where F is known in the art as the smallest feature size capable of fabrication by conventional fabrication techniques. Therefore, the cell area of each memory cell 110 may be substantially equal to $4F^2$.

The memory array 600 may include memory cells 110 aligned in rows and columns in the same horizontal plane. The first conductive material 118 forming the source regions 120 of each transistor 116 may be arranged perpendicular to the channel material 142 forming the channel regions 144 of each transistor 116. Likewise, the second conductive material 148 forming the drain region 150 of each transistor 116 may be arranged perpendicular to the channel material 142 forming the channel region 144 of each transistor 116. Each memory cell 110 may include a channel region 144 formed of a channel material 142 including an oxide semiconductor material. Each memory cell 110 may also include a source contact 102 and/or a drain contact 104 that couple with the channel material 142 to reduce the Schottky barrier in comparison to conventional devices.

The second insulative material 140 and the gate electrodes 126 may be arranged in parallel to the channel material 142 and perpendicular to the first conductive material 118. Multiple memory cells 110 within a particular row may be in operative communication with the same gate electrode 126, second insulative material 140, and channel material 142. Therefore, for example, a gate electrode 126 in operative communication with the channel region 144 of a first memory cell 110 may also be in operative communication with the channel region 144 of a second memory cell 110 neighboring the first memory cell 110. Correspondingly, multiple memory cells 110 within a particular column may be in operative communication with the same first conductive material material 118.

A method of forming transistor, a memory cell, memory array or other memory structure is also disclosed. The method comprises forming a transistor supported by a substrate comprising: forming a source region including a source contact including a first conductive material, forming a drain region including a drain contact including a second conductive material, and forming a channel region including an oxide semiconductor material coupled with the source region at a first interface with the source contact, and with the drain region at a second interface with the drain contact, wherein at least one of the first interface or the second interface is a non-Schottky interface formed by the channel material and the respective conductive material of the source contact or the drain contact.

FIGS. 7A through 7J depict various stages of a fabrication process according to the disclosed embodiment of a method of forming a transistor. The method may result in the fabrication of a memory cell 110 such as that discussed above and depicted in FIGS. 1A and 1B. The fabrication process depicted by FIGS. 7A through 7J are described herein as a non-limiting example of a method for forming a transistor or memory structure. Various other fabrication processes for forming the transistors are also contemplated as known by those of ordinary skill in the art.

Figure 7A:
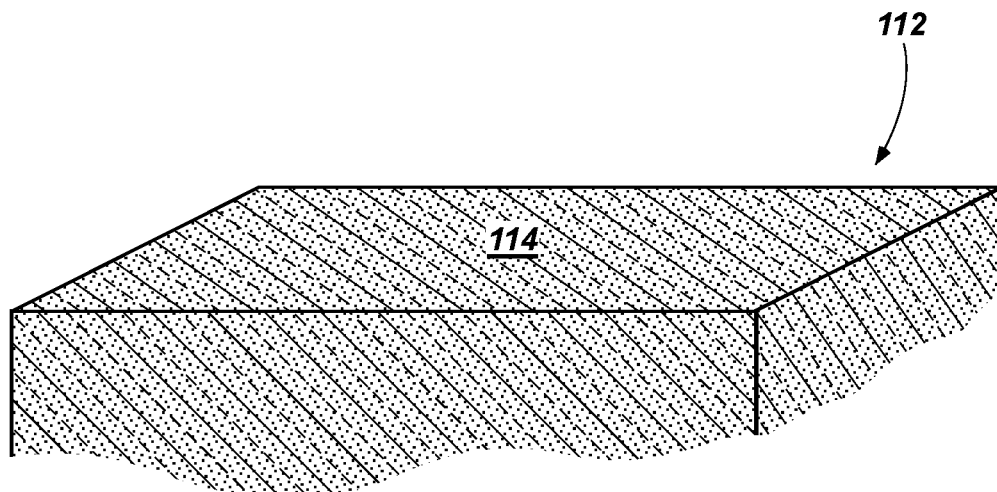
FIGS. 7A through 7J depict various stages of a fabrication process according to the disclosed embodiment of a method of forming a thin film transistor.

With particular reference to FIG. 7A, the method may include forming a substrate 112 having a primary surface 114. The substrate 112, or at least the primary surface 114, may be formed of a semiconductor material (e.g., silicon) or other material as known in the art.

Figure 7B:
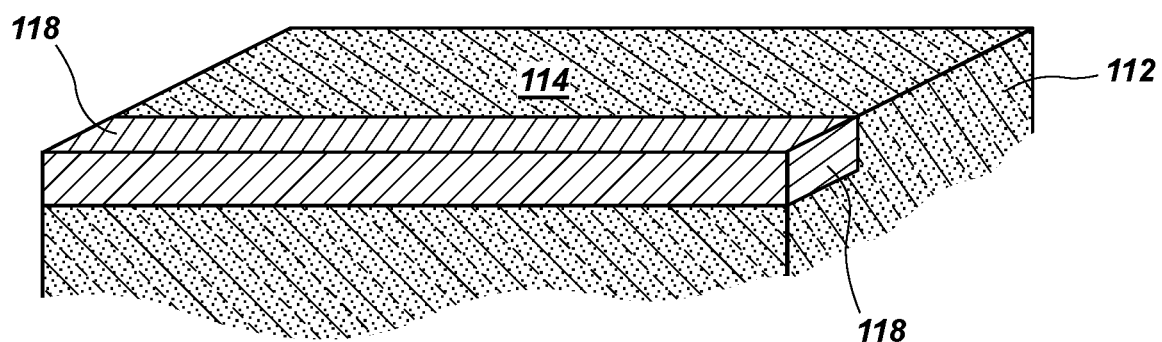

With reference to FIG. 7B, the method includes forming a first conductive material 118 supported by the substrate 112. The first conductive material 118 may be formed in a continuous layer covering the primary surface 114 of the substrate 112, as shown in FIG. 1B. The first conductive material 118 may alternatively be formed as an elongated line on or within the substrate 112, as shown in FIG. 7B.

Elongated lines of the first conductive material 118 may be conducive for inclusion in a memory cell 110 within an array of aligned memory cells 110. As such, the first conductive material 118 of one memory cell 110 may extend to other memory cells 110 in a particular row or column. A plurality of aligned elongated lines of the first conductive material 118 may be arranged in parallel and be separated from one another by a portion of the substrate 112.

As illustrated in FIG. 7B, the first conductive material 118 is formed as a line of metal within the substrate 112 such that a top surface of the first conductive material 118 is aligned with the plane defined by the primary surface 114 of the substrate 112. In some embodiments, the method may include etching a trench into the substrate 112 and depositing the first conductive material 118 within the trench. Forming the first conductive material 118 may further include planarizing the top surfaces of the first conductive material 118 and the primary surface 114 of the substrate 112 or planarizing just the top surface of the first conductive material 118. Planarizing the first conductive material 118 and substrate 112 may include abrasive planarization, chemical mechanical polishing or planarization (CMP), an etching process, or other known methods.

Figure 7C:
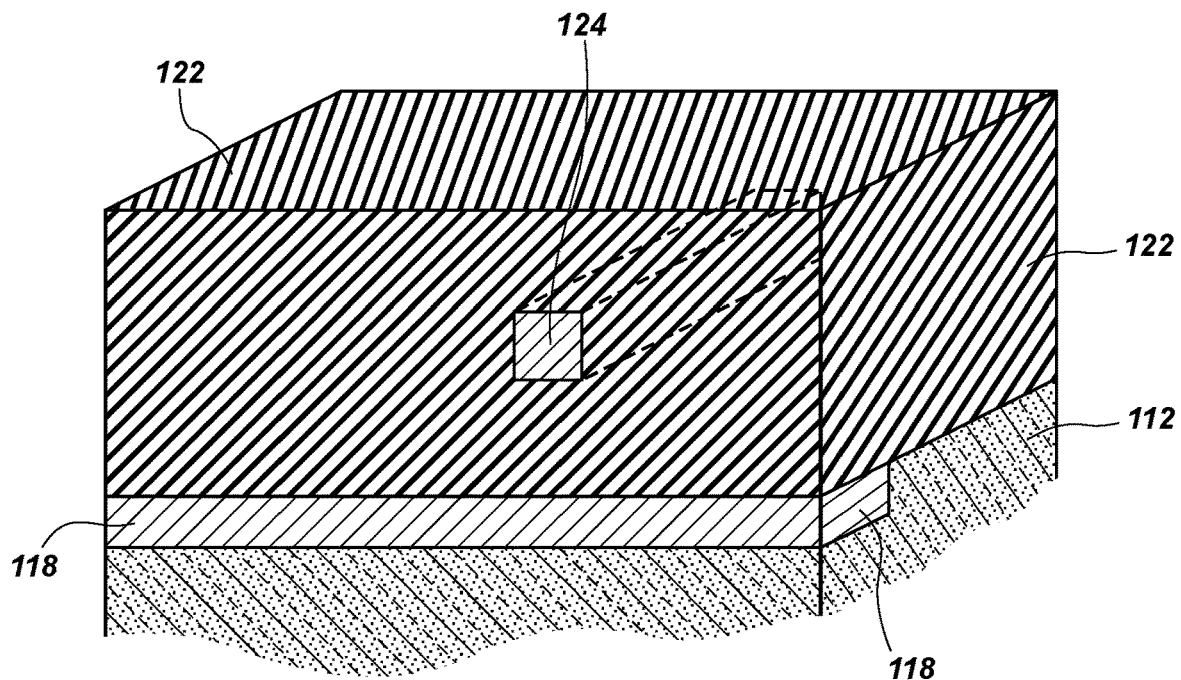

With reference to FIG. 7C, the present method further includes forming a third conductive material 124 isolated from the first conductive material 118. Forming the third conductive material 124 isolated from the first conductive material 118 may include forming the third conductive material 124 such that the third conductive material 124 appears to be floating within a first insulative material 122. These techniques may include depositing a first amount of first insulative material 122, forming the third conductive material 124 on or in the top surface of the first deposited amount of first insulative material 122, and applying a second amount of first insulative material 122 to cover the third conductive material 124. It may further include planarizing the top surface of the second amount of first insulative material 122. Planarizing the top surface of the second amount of first insulative material 122 may be accomplished with any of the aforementioned planarizing techniques or another appropriate technique selected by one having ordinary skill in the art.

Figure 7D:
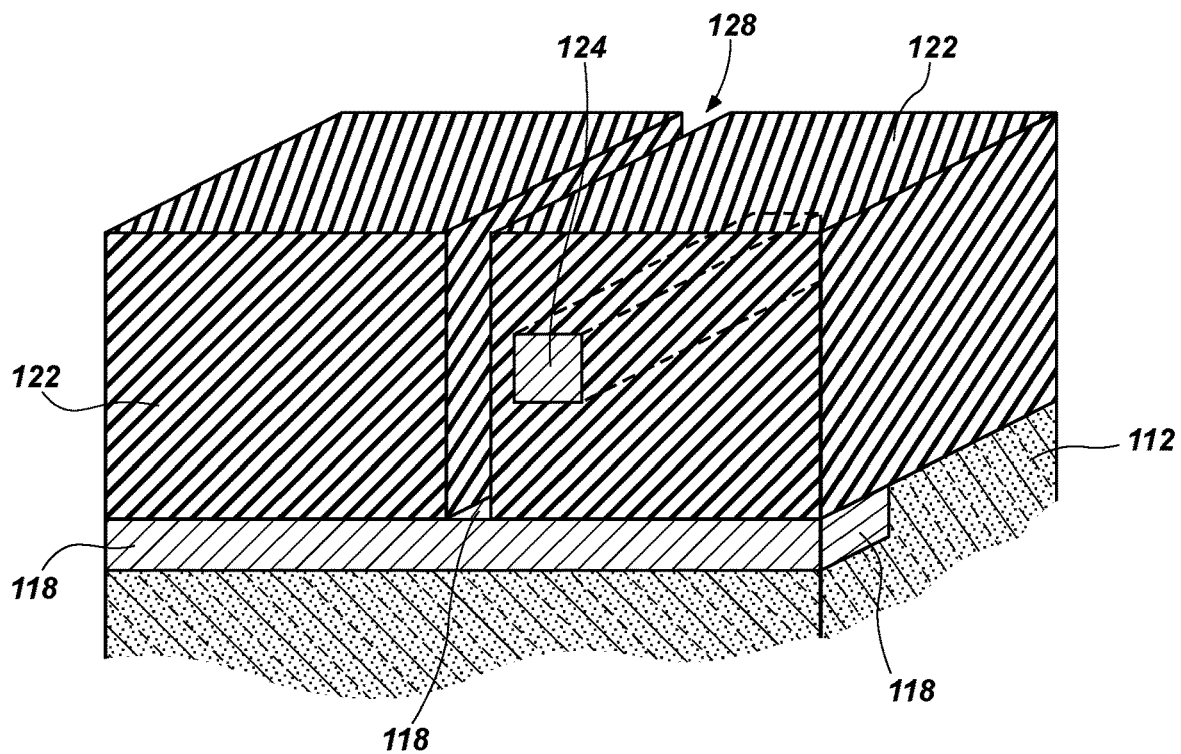
Figure 7E:
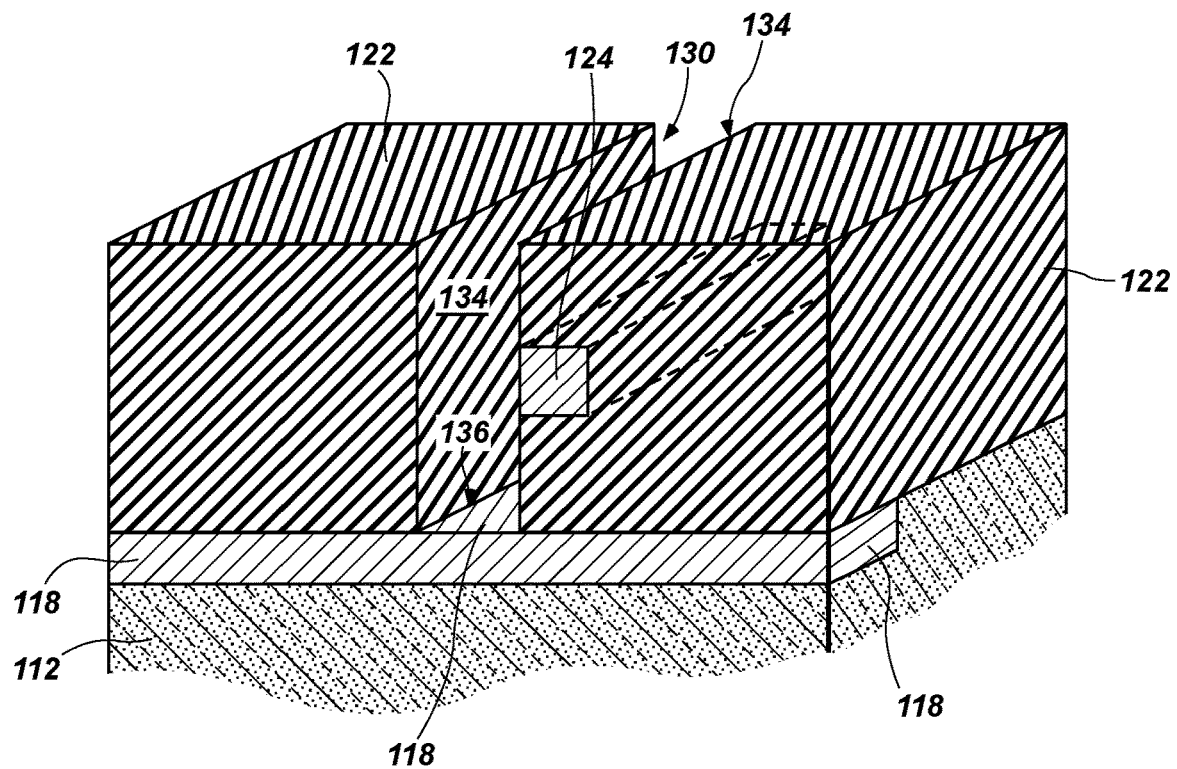

With reference to FIGS. 7D and 7E, the present method further includes forming an opening bordered at least in part by portions of the first conductive material 118 and the third conductive material 124. Forming such an opening may be accomplished in one or more stages. The opening may be formed by forming a first opening 128 to expose a portion of the first conductive material 118, as shown in FIG. 2D, and then by forming a second opening 130 to also expose a portion of the third conductive material 124, as shown in FIG. 2E. Alternatively, the opening may be formed by exposing both the first conductive material 118 and the third conductive material 124 in one step. Selecting and implementing the appropriate technique or techniques to form the opening exposing a portion of the first conductive material 118 and the third conductive material 124 may be understood by those of skill in the art. These techniques may include isotropically etching the first insulative material 122 to form first opening 128 to contact a portion of the first conductive material 118. The techniques may further include anisotropically etching the first insulative material 122 to expand the width of the previously-formed first opening 128 until a portion of the third conductive material 124 is also exposed, thus forming the second opening 130. For example, without limitation, the second opening 130 may be formed using a reactive ion etch process.

Due to the use of such techniques to form the opening bordered at least in part by the first conductive material 118 and the third conductive material 124, the third conductive material 124 may be offset from the positioning of the first conductive material 118. That is, in some embodiments, the third conductive material 124 may be formed in exact alignment with the first conductive material 118 such that the horizontal sides of the first conductive material 118 align vertically with the horizontal sides of the third conductive material 124. In such an embodiment, the third conductive material 124 may completely overlap and align with the first conductive material 118. In other embodiments, one of the third conductive material 124 and the first conductive material 118 may completely overlap the other such that vertical planes perpendicular to the primary surface 114 of the substrate 112 passing through one of the materials 124, 118 intersects with the other material 118, 124. In other embodiments, the third conductive material 124 may be formed to partially overlap the first conductive material 118 such that at least a portion of both the first conductive material 118 and the third conductive material 124 occupy space in a vertical plane perpendicular to the primary surface 114 of the substrate 112. In still other embodiments, the third conductive material 124 may be completely offset from the first conductive material 118 such that no vertical plane perpendicular to the primary surface 114 of the substrate 112 intersects both the first conductive material 118 and the third conductive material 124. Regardless of the overlapping or non-overlapping positions of the first conductive material 118 and the third conductive material 124, in forming the opening 130, at least a portion of the first conductive material 118 is exposed and at least a portion of the third conductive material 124 is exposed.

According to the depicted embodiment, the formed second opening 130 is bordered at least in part along a bottom 136 of second opening 130 by an upper portion of the first conductive material 118 and is bordered at least in part along one of sidewalls 134 of the second opening 130 by a side portion of third conductive material 124. In embodiments involving a single-sided gate electrode 126, the second opening 130 may be formed by forming a trench through first insulative material 122 to expose at least a portion of first conductive material 118 and third conductive material 124. In other embodiments, such as those in which the gate electrode 126 is a dual-sided gate, a surround gate, a ring gate, or a "U" gate, forming the second opening 130 may include removing central portions of the third conductive material 124 to form the second opening 130 passing through the third conductive material 124. Such second opening 130 may be bordered in part along the bottom 136 of second opening 130 by an upper portion of the first conductive material 118 and bordered along multiple sidewalls 134 by side portions of the third conductive material 124.

Figure 7F:
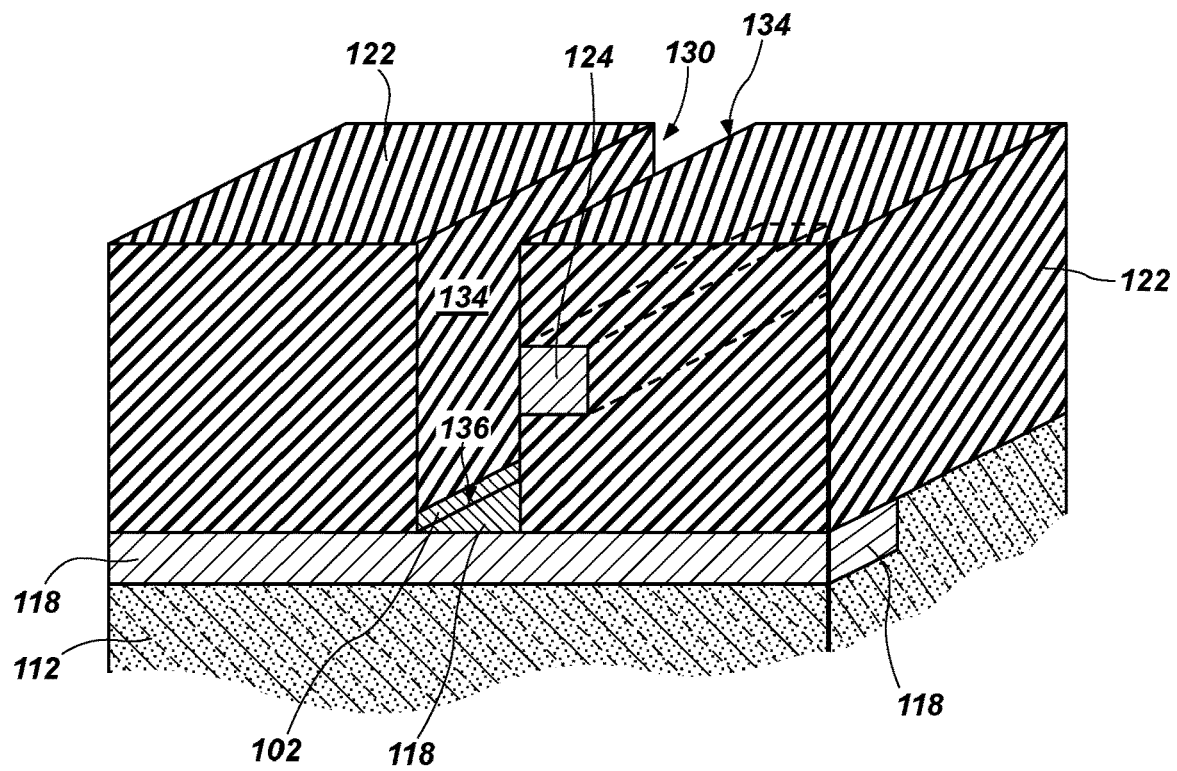

With reference to FIG. 7F, the method includes forming a material for the source contact 102 to be disposed within the formed opening 130 and atop the first conductive material 118. As discussed above, the material for the source contact 102 may include Ruthenium, Indium Tin Oxide, or other material that may form a conductive oxide interface with the channel material that will be formed in contact with the source contact 102. For embodiments in which the source contact 102 is at least partially embedded within the first conductive material 118, the first conductive material 118 may have a cavity formed herein (e.g., at the time of forming opening 130 or in a prior fabrication step). For embodiments in which the source contact 102 is coextensive with the first conductive material 118, the source contact 102 may be disposed on the first conductive material 118 prior to formation of the first insulative material 122 so as to have the source contact 102 be positioned between the first insulative material 122 and the first conductive material 118. For embodiments in which the source contact 102 and the first conductive material 118 are not separate materials, the source contact 102 may replace the first conductive material 118.

Figure 7G:
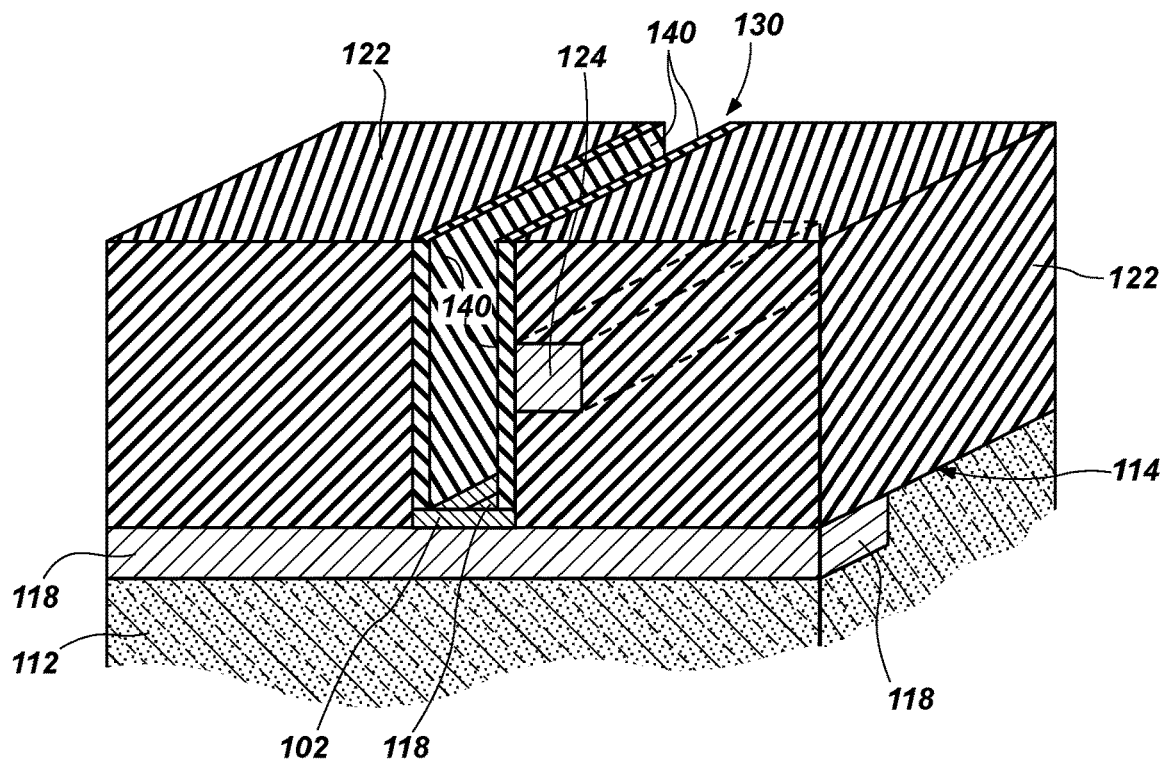

With reference to FIG. 7G, the method includes forming a second insulative material 140 on the sidewalls 134 of the formed opening 130. The second insulative material 140 may be formed of a dielectric material, such as an oxide. The second insulative material 140 may be formed by depositing the material conformally on the sidewalls 134. For example, without limitation, the second insulative material 140 may be formed by atomic layer deposition (ALD). Selecting and implementing an appropriate technique to form the second insulative material 140 on the sidewalls 134 of the second opening 130 may be understood by those of skill in the art. Forming the second insulative material 140 along the sidewalls 134 of the second opening 130 may reduce the width of second opening 130, forming a slightly narrower opening 130.

Forming the second insulative material 140 may include forming the second insulative material 140 not only on the sidewalls 134 of the second opening 130, but also on the exposed surfaces of the third conductive material 124 and the source contact 102. A material-removing technique, such as a conventional spacer etching technique, may be used to remove the second insulative material 140 covering the upper surface of the first conductive material 118, while leaving third conductive material 124 covered by second insulative material 140.

Figure 7H:
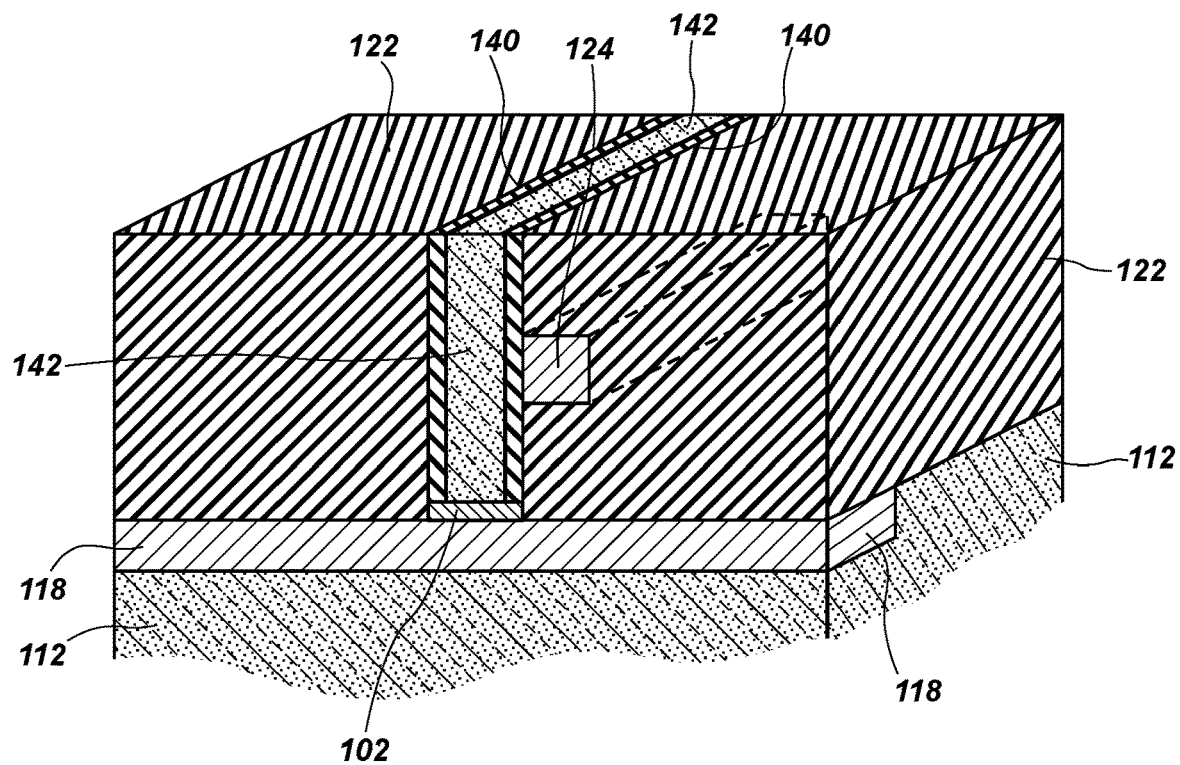

With reference to FIG. 7H, opening 130 is filled with a channel material 142 to form the channel region 144 (FIG. 1A). The channel material 142 may be an oxide semiconductor material. Filling the opening 130 with the channel material 142 may be accomplished at a temperature of less than or equal to about 800 degrees Celsius. For example, without limitation, filling the opening 130 with the material may be accomplished at a temperature of less than or equal to about 650 degrees Celsius. Conventional techniques for forming the other components of the memory cell 110 (e.g., the first conductive material 118, the third conductive material 124, and the second insulative material 140) at fabrication temperatures less than 800 degrees Celsius are known in the art. Such techniques may require, for example, fabrication temperatures less than 650 degrees Celsius (e.g., temperatures in the range of 200 to 600 degrees Celsius). The method may also include planarizing the upper surface of the first insulative material 122, the second insulative material 140, and the channel material 142. Planarizing these upper surfaces may be accomplished using any planarization technique.

Figure 7I:
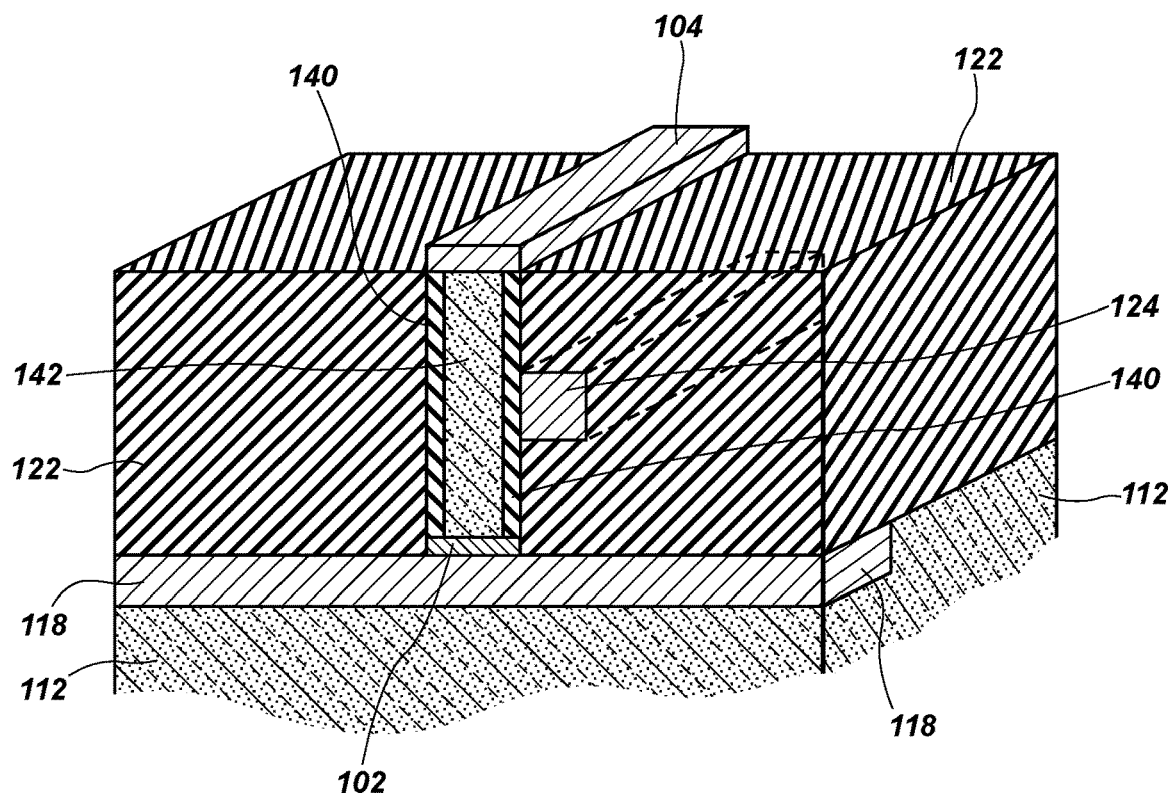

With reference to FIG. 7I, the method further includes forming a drain contact 104 atop and in contact with the channel material 142. As discussed above, the material for the drain contact 104 may include Ruthenium, or other material as discussed above that may form a non-Schottky interface with the channel material 142. The direct contact between the drain contact 104 and the channel material 142 may form a non-Schottky drain region. The second conductive material 148 may be formed in a continuous line so as to align with the length of the channel material 142.

Figure 7J:
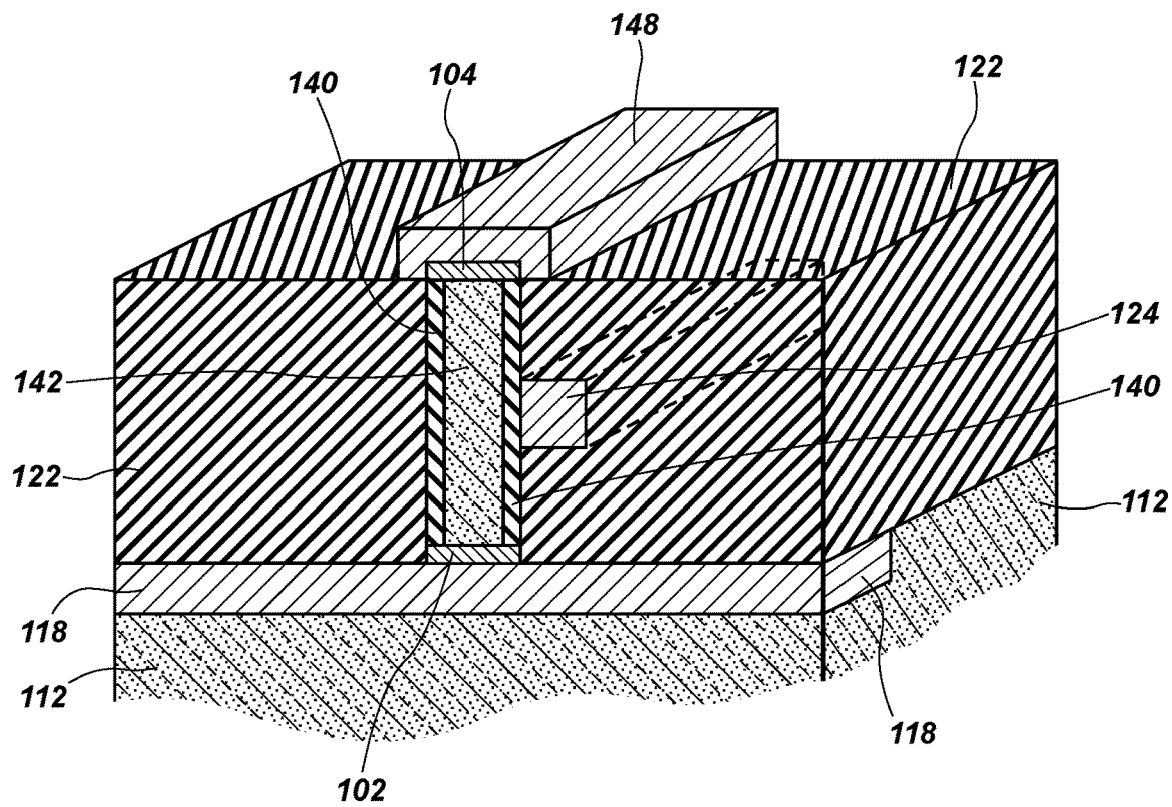

With reference to FIG. 7J, the method further includes forming a second conductive material 148 atop and in contact with the drain contact 104. The second conductive material 148 may be formed in a continuous line so as to align with the length of the drain contact 104. When further forming a memory cell, a storage element (e.g., capacitor) may also be formed over the second conductive material 148 to form a memory cell according to the various configurations of storage elements known by those of ordinary skill in the art.

In some embodiments, forming the transistor may include a gate last flow formation in which the stack of films comprising the drain contact, source contact, and channel material are deposited, etched first to form lines, filled and etched again in perpendicular direction to form a pillar followed by gate-oxide and gate metal. Other methods of forming the transistor are further contemplated as known by those of ordinary skill in the art.

Figure 8:
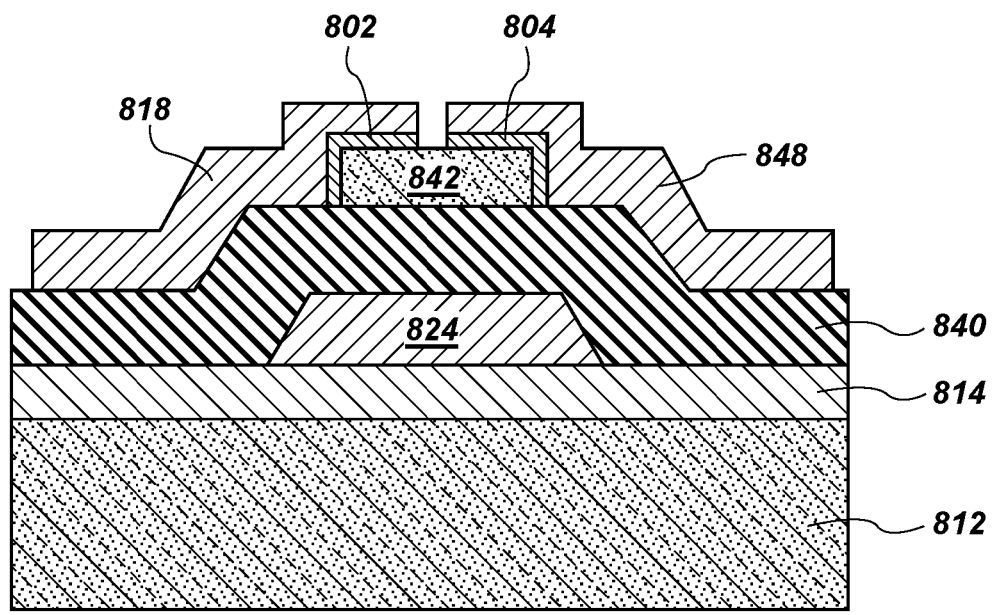
FIGS. 8 and 9 are cross-sectional front views of a schematic of an access transistor configured in a planar configuration according to embodiments of the present disclosure.
Figure 9:
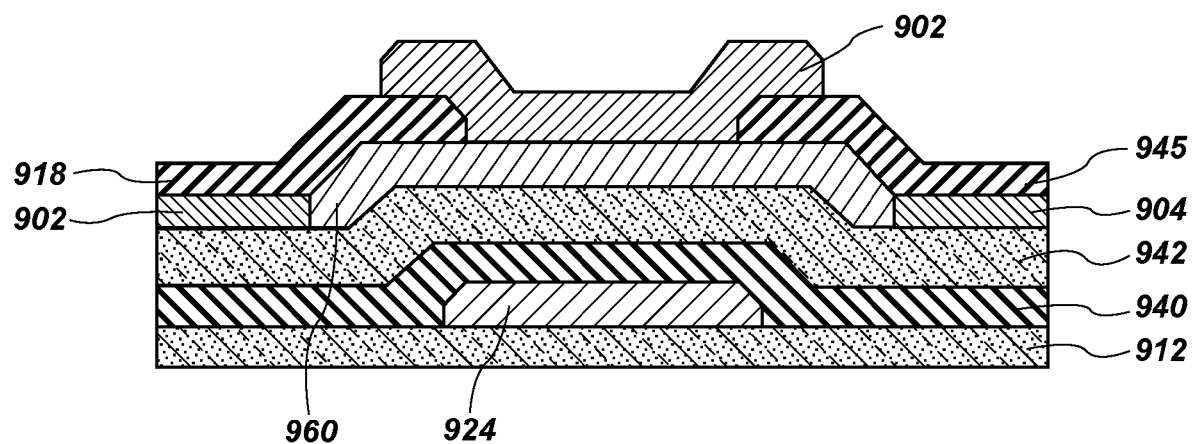

In some embodiments the memory cell may be structured to include a planar access transistor (i.e., also referred to as a horizontal access transistor). FIG. 8 and FIG. 9 show non-limiting examples of such planar access transistors according to embodiments of the present disclosure.

Referring to FIG. 8, the transistor may include a substrate 812 upon which the transistor is supported. A gate electrode 824 may be disposed on the substrate 812. In some embodiments, an additional material 814 (e.g., a silicon oxide material) may be disposed between the conductive material for the gate electrode 824 and the substrate 812. A gate oxide material 840 may be formed over the gate electrode 824 including around the side walls of the gate electrode 824. The channel material 842 may be formed on the gate oxide material 840, and be coupled with a first conductive material 818 via a source contact 802, and with a second conductive material 848 via a drain contact 804. The channel material 842 may be formed from an oxide semiconductor material that may form non-Schottky interfaces with the source contact 802 and the drain contact 804 as discussed above. As shown in FIG. 8, the channel material 842 may have a shorter width than the gate oxide material 840, and the source contact 802 and the drain contact 804 may each surround at least two sides of the channel material 842. The source contact 802 and the drain contact 804 may be disposed proximate the inner ends of their respective conductive materials 818, 848. Although FIG. 8 depicts the source contact 802 and the drain contact 804 as extending only to the end of the channel material 842, in some embodiments the source contact 802 and the drain contact 804 may continue extending along the interface between the gate oxide material 840 and the respective conductive materials 818, 848.

Referring to FIG. 9, the transistor may include a substrate 912, a gate electrode 924, a gate oxide 940, and a channel material 942 stacked similarly as in FIG. 8. One difference between the embodiments of FIGS. 8 and 9 is that the channel material 942 and the gate oxide 940 may be substantially coextensive in length. In addition, the source contact 902 and the drain contact 904 may be disposed on only the top side of the channel material 942, and proximate the outer end of the respective conductive materials 918, 945. The transistor may further include additional materials, such as an etch stop material 960 and a passivation material formed over the channel material 942. Other configurations of horizontal transistors are also contemplated including top gate or bottom gate configurations.

Figure 10A:
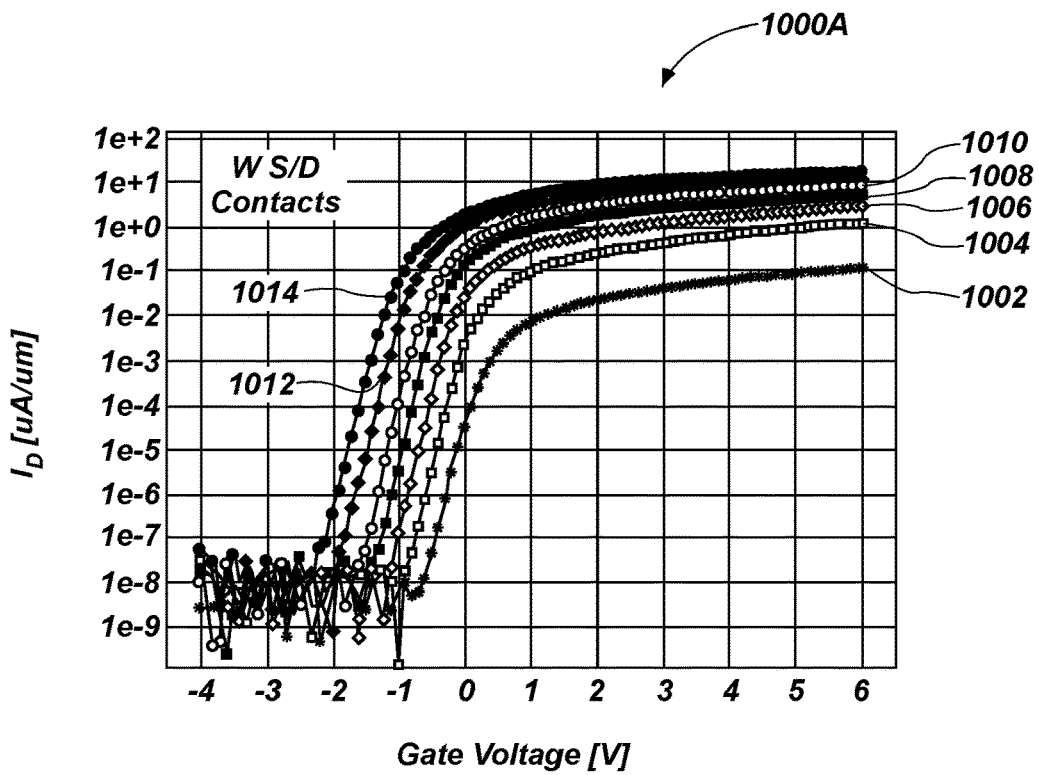
FIG. 10A and FIG. 10B are graphs illustrating the drive current $I_D$ for a transistor when applying various gate voltages.
Figure 10B:
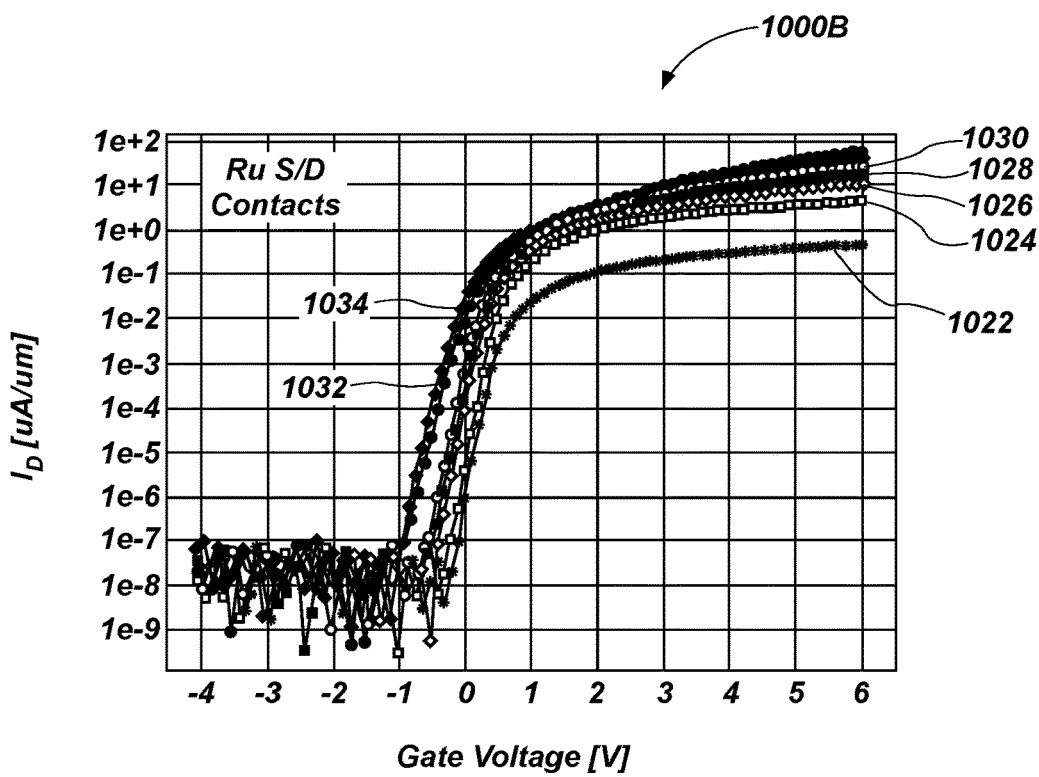

FIG. 10A and FIG. 10B are graphs, 1000A and 1000B, respectively, illustrating the drive current $I_D$ for a transistor when applying various gate voltages. In particular, FIG. 10A corresponds to a transistor having tungsten (W) source and drain contacts, whereas FIG. 10B corresponds to a transistor having Ruthenium (Ru) source and drain contacts. The different lines 1002-1014 (FIG. 10A), 1022-1034 (FIG. 10B) show different situations of a fixed drain voltage ranging from 0.05 V to 4 V while varying the gate voltage. When comparing the two figures, lines 1002, 1022 correspond to a drain voltage of 0.05 V, lines 1004, 1024 correspond to a drain voltage of 0.5 V, lines 1006, 1026 correspond to a drain voltage of 1 V, lines 1008, 1028 correspond to a drain voltage of 1.5 V, lines 1010, 1030 correspond to a drain voltage of 2 V, lines 1012, 1032 correspond to a drain voltage of 3 V, and lines 1014, 1034 correspond to a drain voltage of 4 V.

Figure 11A:
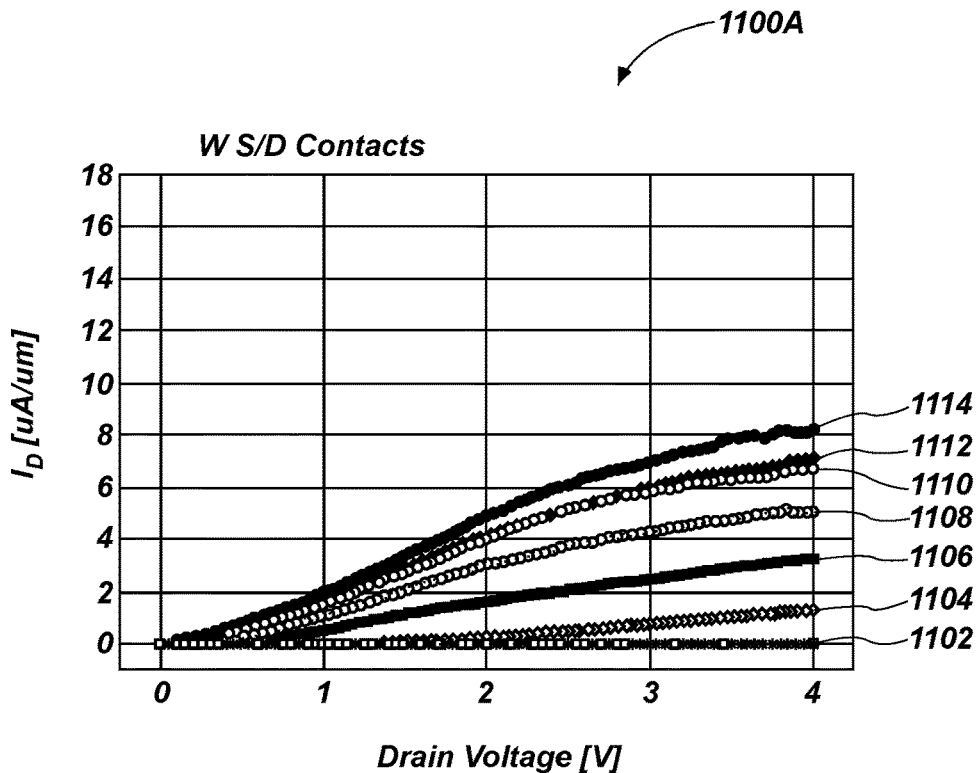
FIG. 11A and FIG. 11B are graphs illustrating the drive current $I_D$ for a transistor when applying various drain voltages.
Figure 11B:
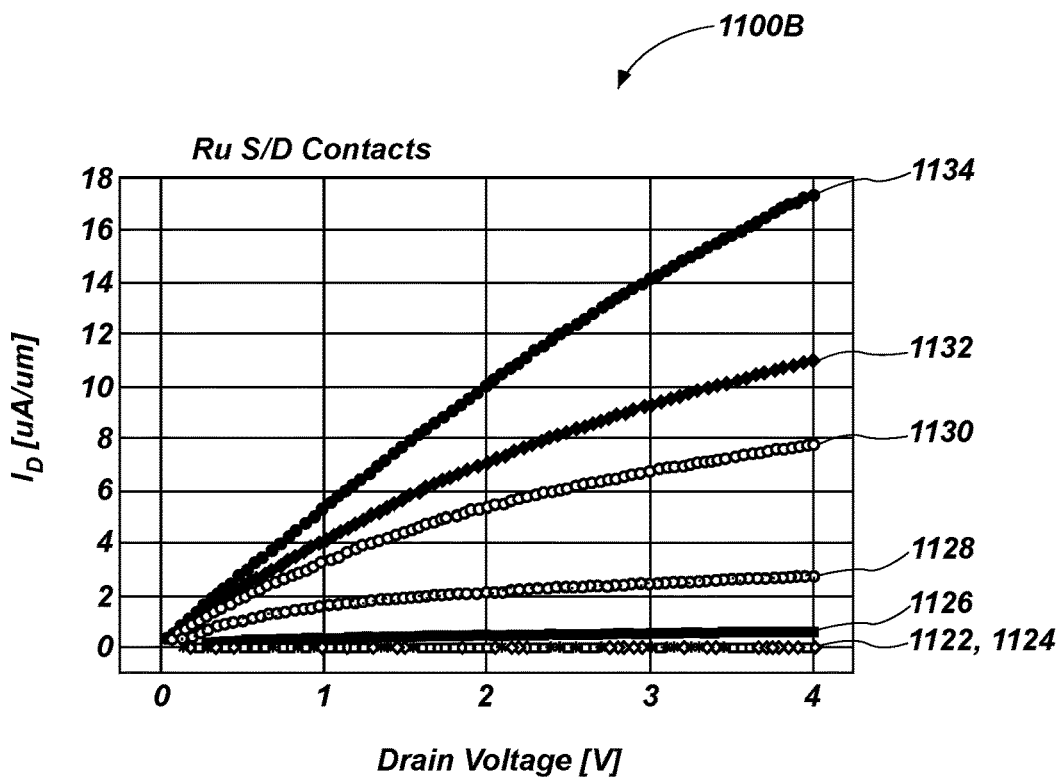

FIG. 11A and FIG. 11B are graphs, 1100A and 1100B, respectively, illustrating the drive current $I_D$ for a transistor when applying various drain voltages. In particular, FIG. 11A corresponds to a transistor having tungsten (W) source and drain contacts, whereas FIG. 11B corresponds to a transistor having Ruthenium (Ru) source and drain contacts. The different lines 1102-1114 (FIG. 11A), 1122-1134 (FIG. 11B) show different situations of a fixed gate voltage ranging from −1 V to 4 V while varying the drain voltage. When comparing the two figures, lines 1102, 1122 correspond to a gate voltage of −1 V, lines 1104, 1124 correspond to a gate voltage of 0 V, lines 1106, 1126 correspond to a gate voltage of 1 V, lines 1108, 1128 correspond to a gate voltage of 2 V, lines 1110, 1130 correspond to a gate voltage of 3 V, lines 1112, 1132 correspond to a gate voltage of 3.4 V, and lines 1114, 1134 correspond to a gate voltage of 4 V. Comparing these lines 1102-1114 with corresponding lines 1122-1134 show the Schottky barrier for the drain voltage is reduced for the Ruthenium contacts (demonstrated by a steeper slope at the lower voltages in FIG. 11B compared with FIG. 11A), which does not need to be overcome in the same way. In addition, the drive current $I_D$ increases substantially for larger gate voltages.

A semiconductor device is also disclosed. The semiconductor device comprises a memory structure comprising a transistor comprising a channel material comprising an oxide semiconductor material, a drain contact and a source contact disposed on opposing ends of the channel material, and a gate electrode. At least one of the drain contact or the source contact comprises a conductive material that forms a non-Schottky interface with the channel material.

Figure 12:
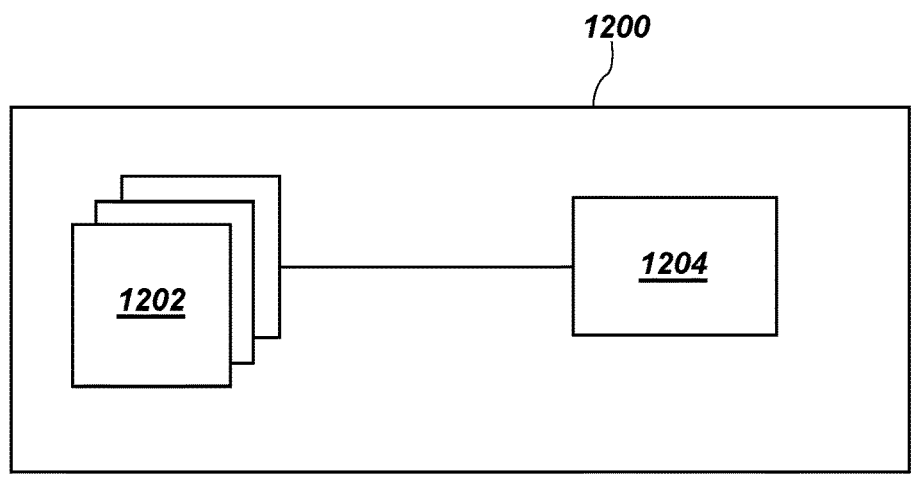
FIG. 12 is a simplified block diagram of a semiconductor device including a memory array of one or more embodiments described herein.

FIG. 12 is a simplified block diagram of a semiconductor device 1200 implemented according to one or more embodiments described herein. In this non-limiting embodiment, the memory structure of the semiconductor device includes a memory array 1202 and a control logic component 1204. The memory array 1202 may include memory cells including access transistors as described above. The transistors may comprise a channel region comprising an oxide semiconductor material and one or more source or drain contacts as discussed above. The control logic component 1204 may be operatively coupled with the memory array 1202 so as to read, write, or re-fresh any or all memory cells within the memory array 1202. Accordingly, a semiconductor device comprising a dynamic random access memory (DRAM) array or other type of memory array is disclosed.

A system is also disclosed. The system comprises a memory array of memory cells. Each memory cell comprises an access transistor and a storage element operably coupled with the access transistor. The access transistor comprises a channel material comprising an oxide semiconductor material, a source contact and a drain contact operably coupled with the channel material on opposing sides to form at least one non-Schottky interface with the channel material; and a gate electrode.

Figure 13:
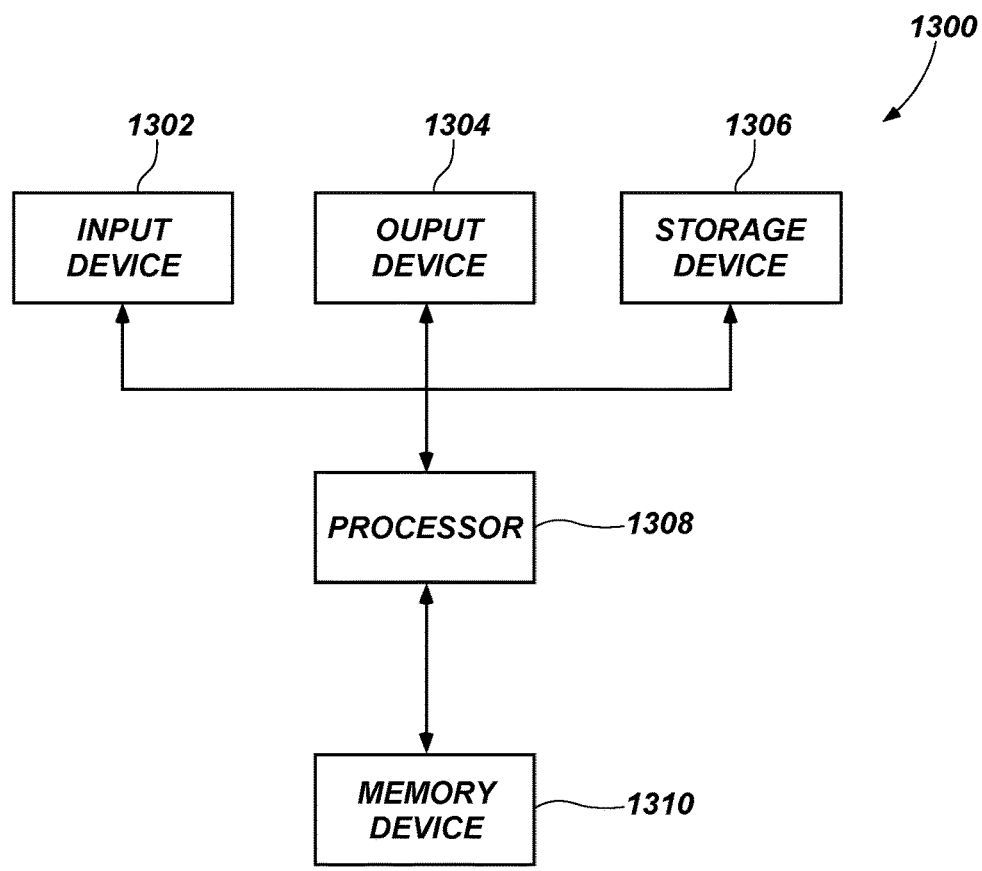
FIG. 13 is a simplified block diagram of a system implemented according to one or more embodiments described herein.

FIG. 13 is a simplified block diagram of an electronic system 1300 implemented according to one or more embodiments described herein. The electronic system 1300 includes at least one input device 1302. The input device 1302 may be a keyboard, a mouse, or a touch screen. The electronic system 1300 further includes at least one output device 1304. The output device 1304 may be a monitor, touch screen, or speaker. The input device 1302 and the output device 1304 are not necessarily separable from one another. The electronic system 1300 further includes a storage device 1306. The input device 1302, output device 1304, and storage device 1306 are coupled to a processor 1308. The electronic system 1300 further includes a memory device 1310 coupled to the processor 1308. The memory device 1310 includes at least one memory cell according to one or more embodiments described herein. The memory device 1310 may include an array of memory cells. The electronic system 1300 may be include a computing, processing, industrial, or consumer product. For example, without limitation, the system 1300 may include a personal computer or computer hardware component, a server or other networking hardware component, a handheld device, a tablet computer, an electronic notebook, a camera, a phone, a music player, a wireless device, a display, a chip set, a game, a vehicle, or other known systems.

While the present disclosure is susceptible to various modifications and alternative forms in implementation thereof, specific embodiments have been shown by way of example in the drawings and have been described in detail herein. However, the present disclosure is not intended to be limited to the particular forms disclosed. Rather, the present disclosure encompasses all modifications, combinations, equivalents, variations, and alternatives falling within the scope of the present disclosure as defined by the following appended claims and their legal equivalents.

What is claimed is:

1. A semiconductor device, comprising:
   a first conductive line structure;
   a second conductive line structure overlying the first conductive line structure;
   a transistor between the first conductive line structure and the second conductive line structure, the transistor comprising:
      at least one gate electrode;
      a channel comprising an oxide semiconductor material; and
      a source contact structure in physical contact with the oxide semiconductor material of the channel and the first conductive line structure, the source contact structure continuously extending across an entirety of an upper surface of the first conductive line structure and comprising:
         a first region at an interface with the oxide semiconductor material and comprising ruthenium oxide; and
         a second region directly between the first region and the upper surface of the first conductive line structure and comprising elemental ruthenium;
      a drain contact structure in physical contact with the oxide semiconductor material of the channel and a lower surface of the second conductive line structure; and
      a gate insulator material directly on an upper, horizontally extending surface of the source contact structure, the gate insulator material directly physically contacting and horizontally extending between the oxide semiconductor material of the channel and the at least one gate electrode.

2. The semiconductor device of claim 1, wherein the oxide semiconductor material is selected from the group consisting of ZTO, IZO, IGZO, $In_2O_3$, $SnO_2$, and InGaSiO.

3. The semiconductor device of claim 1, wherein:
the source contact structure has a different material composition than the first conductive line structure; and
the drain contact structure has a different material composition than the second conductive line structure.

4. The semiconductor device of claim 1, wherein the transistor is configured in a vertical orientation.

5. The semiconductor device of claim 1, wherein the transistor is configured in a planar orientation.

6. The semiconductor device of claim 1, further comprising a memory cell including a storage element operably coupled with the transistor.

7. The semiconductor device of claim 1, wherein the source contact structure is substantially planar.

8. The semiconductor device of claim 1, further comprising a gate insulator material extending from a side surface of the at least one gate electrode to a side surface of the oxide semiconductor material of the channel.

9. A semiconductor device, comprising:
a transistor comprising:
at least one gate electrode;
a channel comprising an oxide semiconductor material; and
a drain contact structure vertically overlying and physically contacting the channel, the drain contact structure comprising indium tin oxide (ITO);
a source contact structure vertically underlying and physically contacting the channel, the source contact structure comprising additional ITO;
at least one conductive gate structure horizontally neighboring the channel and substantially confined within vertical boundaries of the channel, the conductive gate structure having a side surface substantially coplanar with a side surface of the source contact structure; and
a gate insulator material directly on an upper, horizontally extending surface of the source contact structure, the gate insulator material directly physically contacting and horizontally extending between the oxide semiconductor material of the channel and the at least one conductive gate structure;
a first conductive line structure vertically underlying and in direct physical contact with the source contact structure, the first conductive line structure having a different material composition than the source contact structure; and
a second conductive line structure vertically overlying and in direct physical contact with the drain contact structure, the second conductive line structure having a different material composition than the drain contact structure.

10. The semiconductor device of claim 9, wherein the at least one gate electrode comprises only one gate electrode.

11. The semiconductor device of claim 9, wherein the at least one gate electrode comprises two gate electrodes.

12. The semiconductor device of claim 9, wherein the channel consists of an amorphous oxide semiconductor material.

13. The semiconductor device of claim 9, further comprising a storage element operably coupled with the transistor, the transistor comprises an access device transistor for the storage element.

14. The semiconductor device of claim 9, wherein the transistor is a select device for a memory component selected from the group consisting of a deck of memory cells and a back end of line routing component.

15. The semiconductor device of claim 9, wherein the source contact structure is embedded within the first conductive line structure.

16. The semiconductor device of claim 9, wherein the source contact structure is coextensive with the first conductive line structure.

17. A method of forming a transistor, comprising:
forming a conductive gate structure in dielectric material overlying a first conductive line structure;
forming a trench in the dielectric material, the trench exposing a side surface of the conductive gate structure and an upper surface of the first conductive line structure;
forming a source contact structure comprising one or more of ruthenium and indium tin oxide (ITO) within the trench and on the first conductive line structure, the source contact structure having a different material composition than the first conductive line structure;
forming a channel comprising an oxide semiconductor material within the trench and on the source contact structure, an interface between the source contact structure and the channel comprising a non-Schottky interface; and
forming a drain contact structure on the channel.

18. The method of claim 17, wherein the source contract structure and the drain contact structure have substantially the same material composition.

19. The method of claim 17, further comprising forming a second conductive line structure on the drain contact structure, the second conductive line structure horizontally extending orthogonal to the first conductive line structure and having a different material composition than the drain contact structure.

20. The method of claim 17, wherein the oxide semiconductor material is selected from the group consisting of ZTO, IZO, IGZO, $In_2O_3$, $SnO_2$, and InGaSiO.

* * * * *

UNITED STATES PATENT AND TRADEMARK OFFICE
CERTIFICATE OF CORRECTION

PATENT NO. : 11,335,788 B2
APPLICATION NO. : 16/118064
DATED : May 17, 2022
INVENTOR(S) : Durai Vishak Nirmal Ramaswamy, Ramanathan Gandhi and Scott E. Sills It is certified that error appears in the above-identified patent and that said Letters Patent is hereby corrected as shown below:

In the Specification
Column 2, Line 35, change "(SDRAM) flash" to --(SDRAM), flash--
Column 3, Line 31, change "("SOT") substrates," to --("SOI") substrates,--
Column 3, Line 46, change ""front"" to --"front,"--
Column 10, Line 31, change "material material 118." to --conductive material 118.--

Signed and Sealed this
Sixth Day of September, 2022

Katherine Kelly Vidal
*Director of the United States Patent and Trademark Office*